United States Patent
Zhang et al.

(10) Patent No.: US 11,885,979 B2
(45) Date of Patent: Jan. 30, 2024

(54) LOW-LOSS METASURFACE OPTICS FOR DEEP UV

(71) Applicants: University of Maryland, College Park, College Park, MD (US); Government of the United States of America as represented by the Secretary of Commerce, Gaithersburg, MD (US)

(72) Inventors: Cheng Zhang, Gaithersburg, MD (US); Shawn Divitt, Gaithersburg, MD (US); Wenqi Zhu, Vienna, VA (US); Amit Kumar Agrawal, Rockville, MD (US); Henri Lezec, Silver Spring, MD (US)

(73) Assignees: UNIVERSITY OF MARYLAND, COLLEGE PARK, College Park, MD (US); GOVERNMENT OF THE UNITED STATES OF AMERICA AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 141 days.

(21) Appl. No.: 17/136,277

(22) Filed: Dec. 29, 2020

(65) Prior Publication Data

US 2021/0208312 A1 Jul. 8, 2021

Related U.S. Application Data

(60) Provisional application No. 62/956,875, filed on Jan. 3, 2020.

(51) Int. Cl.
*G02B 3/08* (2006.01)
*C23C 16/40* (2006.01)
(Continued)

(52) U.S. Cl.
CPC .............. *G02B 3/08* (2013.01); *C23C 16/042* (2013.01); *C23C 16/40* (2013.01); *C23C 16/405* (2013.01);
(Continued)

(58) Field of Classification Search
None
See application file for complete search history.

(56) References Cited

U.S. PATENT DOCUMENTS

2018/0341090 A1* 11/2018 Devlin ...................... G03F 7/40
2019/0301025 A1* 10/2019 Akselrod .............. C23C 14/021

OTHER PUBLICATIONS

Hausmann et al. "Atomic Layer Deposition of Hafnium and Zirconium Oxides using Metal Amide Precursors" Chem Mater. 14, 4350-4358 (2002) (Year: 2002).*

(Continued)

*Primary Examiner* — Jose I Hernandez-Kenney
(74) *Attorney, Agent, or Firm* — Quarles & Brady LLP; Yakov Sidorin

(57) ABSTRACT

High-performance optical-metasurface-based components configured to at frequencies of UV light and, in particular, in deep UV range and performing multiple optical-wavefront-shaping functions (among which there are high-numerical-aperture lensing, accelerating beam generation, and hologram projection). As a representative material for such components, hafnium oxide demands creation and establishment of a novel process of manufacture that is nevertheless based on general principles of Damascene lithography, to be compatible with existing technology and yet sufficient for producing high-aspect-ratio features that currently-used materials and processes simply do not deliver. The described invention opens a way towards low-form-factor, multifunctional ultraviolet nanophotonic platforms based on flat optical components and enabling diverse applications including (Continued)

lithography, imaging, spectroscopy, and quantum information processing.

13 Claims, 16 Drawing Sheets

(51) Int. Cl.
    C23C 16/04      (2006.01)
    G02B 1/118     (2015.01)
    C23C 16/455    (2006.01)

(52) U.S. Cl.
    CPC .. *C23C 16/45527* (2013.01); *C23C 16/45553* (2013.01); *G02B 1/118* (2013.01)

(56) References Cited

OTHER PUBLICATIONS

Zhang et al. "All-dielectric Deep Ultraviolet Metasurfaces". C. Zhang, S. Divitt, Q. Fan, W. Zhu, A. Agrawal, T. Xu, and H. J. Lezec, "All-dielectric Deep Ultraviolet Metasurfaces," in Conference on Lasers and Electro-Optics, OSA Technical Digest (Optica Publishing Group, 2019), paper FM3C.3. (Year: 2019).*
C. Zhang, S. Divitt, Q. Fan, W. Zhu, A. Agrawal, T. Xu, and H. J. Lezec, "High-Efficiency, All-dielectric Metasurfaces down to the Deep Ultraviolet," in 2019 Conference on Lasers and Electro-Optics Europe and European Quantum Electronics Conference, OSA Technical Digest (Optica Publishing Group, 2019) (Year: 2019).*
Guo et al. "Design of aluminum nitride metalens for broadband ultraviolet incidence routing" (2019). Nanophotonics (8)(1): 171-180 (Year: 2019).*
Hemmatyar et al. "Full color generation with Fano-type resonant HfO2 nanopillars designed by a deep learning approach" (2019). Nanoscale 11, 21266 (Year: 2019).*
Andricacos, P. C., et al. "Damascene copper electroplating for chip interconnections." IBM Journal of Research and Development 42.5 (1998): 567-574.
Arbabi, A., et al. "Dielectric metasurfaces for complete control of phase and polarization with subwavelength spatial resolution and high transmission." Nature nanotechnology 10.11 (2015): 937-943.
Balthasar Mueller, JP, et al. "Metasurface polarization optics: independent phase control of arbitrary orthogonal states of polarization." Physical Review Letters 118.11 (2017): 113901.
Chen, H.-T., et al. "A review of metasurfaces: physics and applications." Reports on progress in physics 79.7 (2016): 076401.
Chen, W. T., et al. "A broadband achromatic metalens for focusing and imaging in the visible." Nature nanotechnology 13.3 (2018): 220-226.
Cottrell, D. M., et al. (2009). Direct generation of accelerating Airy beams using a 3/2 phase-only pattern. Optics letters, 34(17), 2634-2636.
Day, R. N., et al. "The fluorescent protein palette: tools for cellular imaging." Chemical Society Reviews 38.10 (2009): 2887-2921.
Deng, Y., et al. "All-Silicon Broadband Ultraviolet Metasurfaces." Advanced Materials 30.38 (2018): 1802632.
Devlin, R. C., et al. "Broadband high-efficiency dielectric metasurfaces for the visible spectrum." Proceedings of the National Academy of Sciences 113.38 (2016): 10473-10478.
Ding, F. et al. "Gradient metasurfaces: a review of fundamentals and applications." Reports on Progress in Physics 81.2 (2017): 026401.
Divitt, S., et al. "Ultrafast optical pulse shaping using dielectric metasurfaces." Science 364.6443 (2019): 890-894.
Fan, Q., et al. "Broadband generation of photonic spin-controlled arbitrary accelerating light beams in the visible." Nano letters 19.2 (2018): 1158-1165.
Gerchberg, R. W. "A practical algorithm for the determination of phase from image and diffraction plane pictures." Optik 35 (1972): 237-246.

Greenfield, N. J. "Using circular dichroism spectra to estimate protein secondary structure." Nature protocols 1.6 (2006): 2876.
Hausmann, D. M., et al. "Atomic layer deposition of hafnium and zirconium oxides using metal amide precursors." Chemistry of materials 14.10 (2002): 4350-4358.
Henstridge, M., et al. "Accelerating light with metasurfaces." Optica 5.6 (2018): 678-681.
Isiao, H-H, et al. "Fundamentals and applications of metasurfaces." Small Methods 1.4 (2017): 1600064.
Huang, K., et al. "Ultraviolet Metasurfaces of 80% Efficiency with Antiferromagnetic Resonances for Optical Vectorial Anti-Counterfeiting." Laser & Photonics Reviews 13.5 (2019): 1800289.
Kamali, S. M., et al. "A review of dielectric optical metasurfaces for wavefront control." Nanophotonics 7.6 (2018): 1041-1068.
Kamali, S. M., et al. "Angle-multiplexed metasurfaces: encoding independent wavefronts in a single metasurface under different illumination angles." arXiv e-prints (2017): arXiv-1711.
Khorasaninejad, M., et al. "Metalenses at visible wavelengths: Diffraction-limited focusing and subwavelength resolution imaging." Science 352.6290 (2016): 1190-1194.
Kildishev, A. V., et al. "Planar photonics with metasurfaces." Science 339.6125 (2013).
Kukli, K., et al. "Comparison of hafnium oxide films grown by atomic layer deposition from iodide and chloride precursors." Thin Solid Films 416.1-2 (2002): 72-79.
Lin, D., et al. "Dielectric gradient metasurface optical elements." science 345.6194 (2014): 298-302.
Liu, X., et al. "ALD of hafnium oxide thin films from tetrakis (ethylmethylamino) hafnium and ozone." Journal of the electrochemical society 152.3 (2005): G213.
Lowalekar, V. et al. "Etching of zirconium oxide, hafnium oxide, and hafnium silicates in dilute hydrofluoric acid solutions." Journal of materials research 19.4 (2004): 1149-1156.
Ludlow, A. D., et al. "Optical atomic clocks." Reviews of Modern Physics 87.2 (2015): 637.
Luo, X. "Subwavelength optical engineering with metasurface waves." Advanced Optical Materials 6.7 (2018): 1701201.
Novotny, L. et al. Principles of Nano-Optics Ch. 3. Propagation and focusing of optical fields. (Cambridge Univ. Press, Cambridge, 2006).
Ren, H., et al. "Metasurface orbital angular momentum holography." Nature communications 10.1 (2019): 1-8.
Schmid, G. M., et al. "Implementation of an imprint damascene process for interconnect fabrication." Journal of Vacuum Science & Technology B: Microelectronics and Nanometer Structures Processing, Measurement, and Phenomena 24.3 (2006): 1283-1291.
Siviloglou, G. A., et al. "Accelerating finite energy Airy beams." Optics letters 32.8 (2007): 979-981.
Siviloglou, G. A., et al. "Observation of accelerating Airy beams." Physical Review Letters 99.21 (2007): 213901.
Sun, S., et al. "Electromagnetic metasurfaces: physics and applications." Advances in Optics and Photonics 11.2 (2019): 380-479.
Wang, K., et al. "Quantum metasurface for multiphoton interference and state reconstruction." Science 361.6407 (2018): 1104-1108.
Wang, S., et al. "A broadband achromatic metalens in the visible." Nature nanotechnology 13.3 (2018): 227-232.
Wilk, G. D. et al. "High-? gate dielectrics: Current status and materials properties considerations." Journal of applied physics 89.10 (2001): 5243-5275.
Yu, N., et al. (2014). Flat optics with designer metasurfaces. Nature materials, 13(2), 139-150.
Zhang, L., et al. "Advances in full control of electromagnetic waves with metasurfaces." Advanced Optical Materials 4.6 (2016): 818-833.
Jung, H., et al. (Jul. 2019). Kerr solitons with tantala ring resonators. In Nonlinear Optics (pp. NW2A-3). Optical Society of America. 2 pages.
Zhang, C., et al. "All-dielectric deep ultraviolet metasurfaces." CLEO: QELS_Fundamental Science. Optical Society of America, 2019. 2 pages.

* cited by examiner

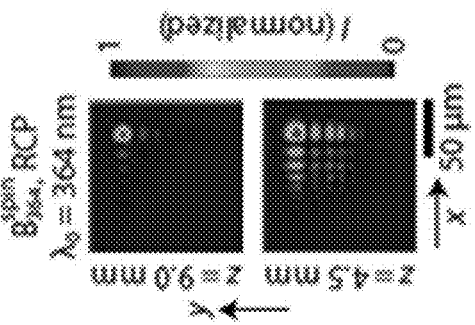
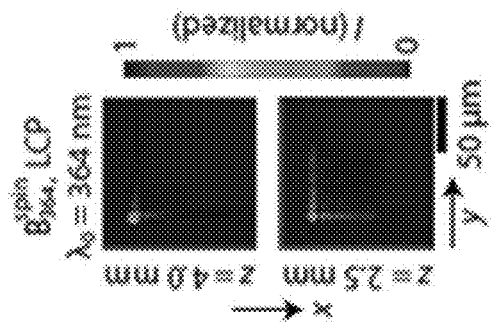
FIG. 5E
FIG. 5F
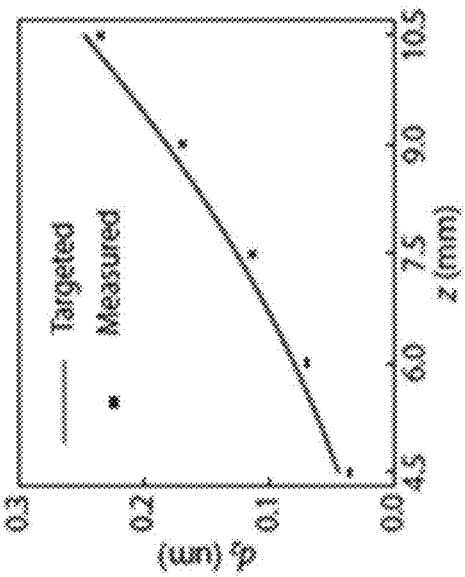
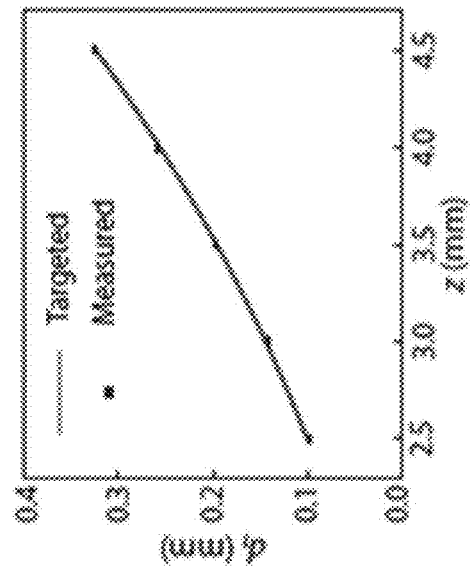
FIG. 5C
FIG. 5D
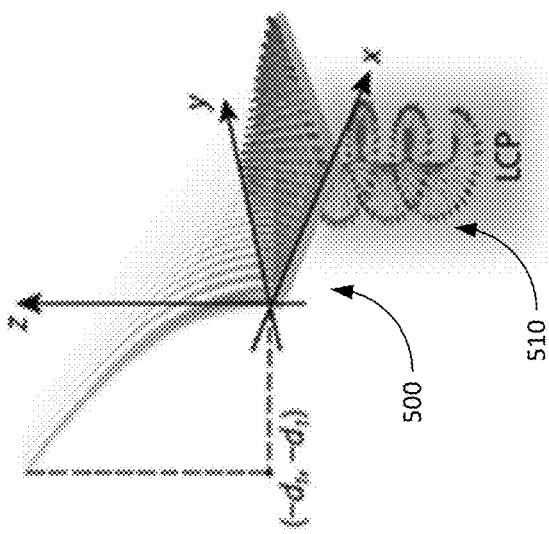
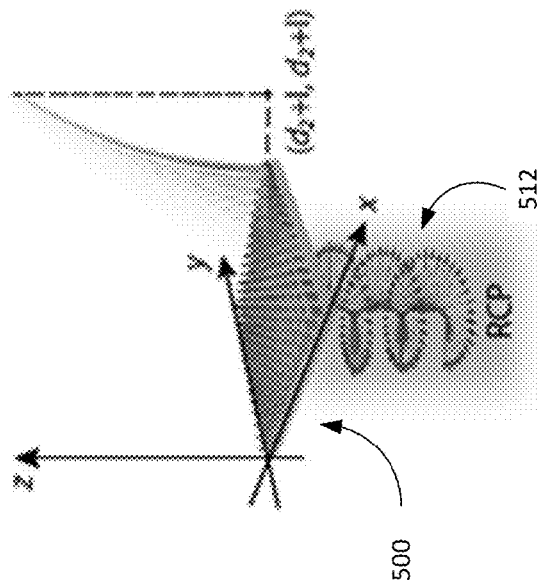
FIG. 5A
FIG. 5B FIG. 6A
FIG. 6B
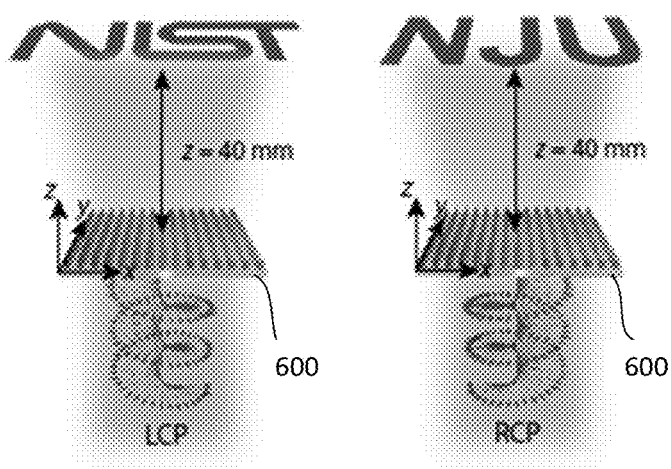
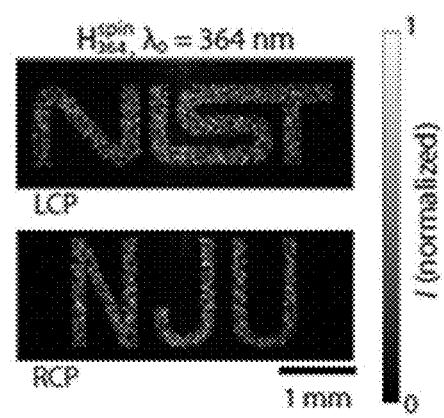
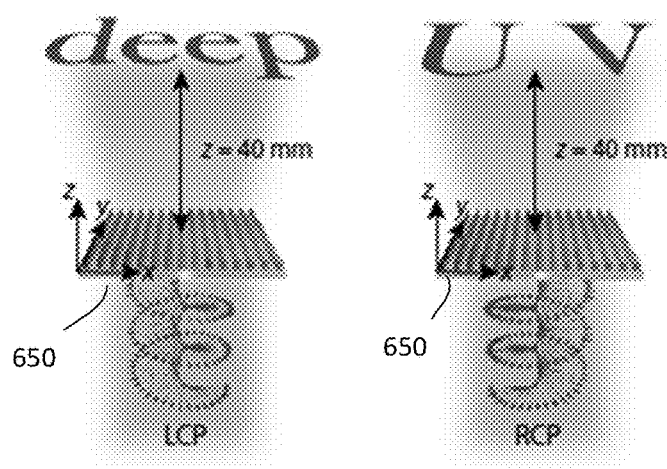
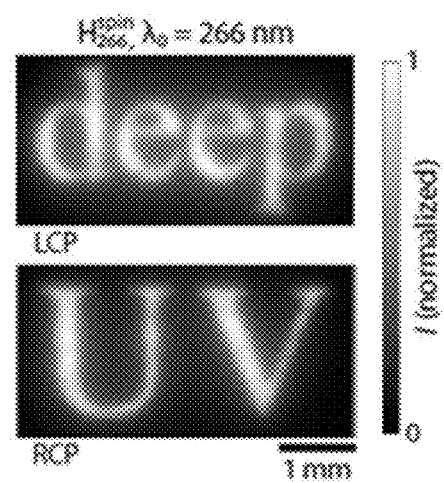
FIG. 6C
FIG. 6D

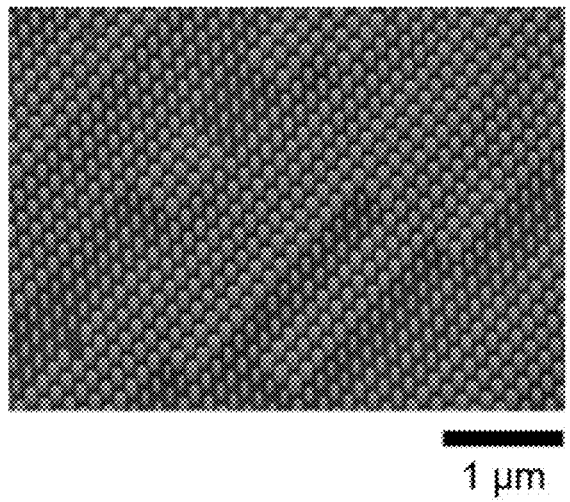
FIG. 12
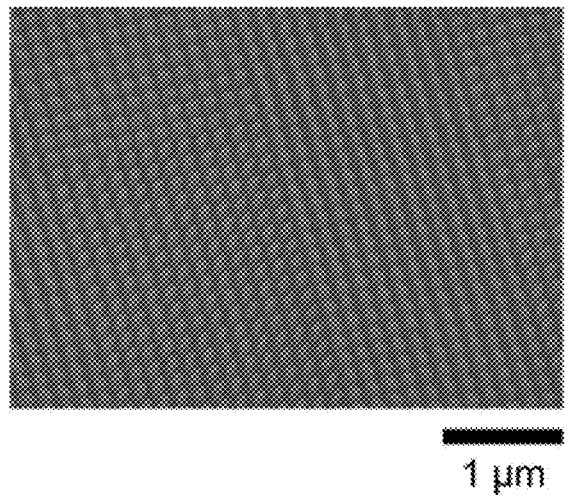
FIG. 14
FIG. 13A
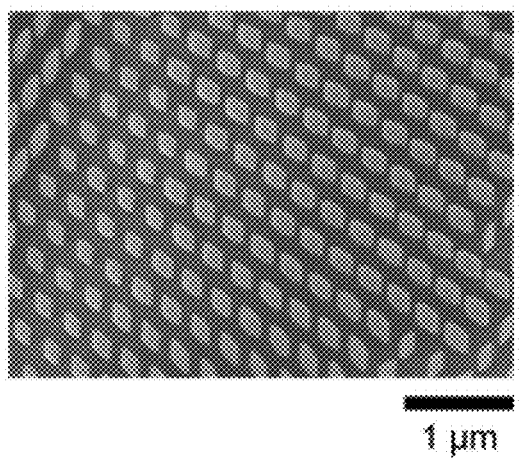
FIG. 13B
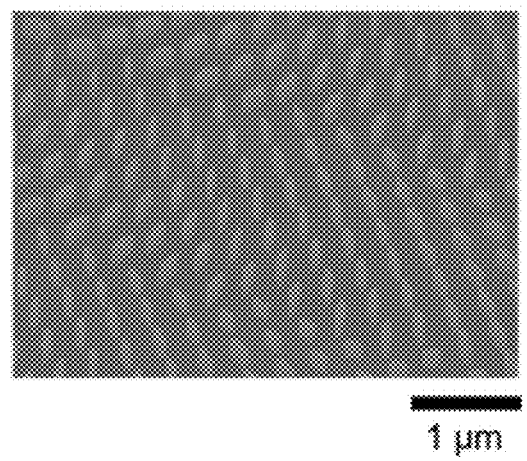

LOW-LOSS METASURFACE OPTICS FOR DEEP UV

CROSS-REFERENCE TO RELATED APPLICATIONS

This patent application claims priority from and benefit of the U.S. provisional patent application No. 62/956,875 titled "Systems, Device, Materials and Methods for Low-Loss Metasurface Optics" and filed on Jan. 3, 2020. The disclosure of the above-identified provisional patent application is incorporated herein by reference.

STATEMENT REGARDING FEDERALLY SPONSORED RESEARCH OR DEVELOPMENT

This invention was made with government support under contract 70NANB14H209 awarded by the National Institute of Standards and Technology. The government has certain rights in the invention.

TECHNICAL FIELD

The invention relates generally to a system, device, materials, and methods for metasurface-based optics and, in particular, to metasurface-based optical devices and systems configured to operate not only in the ultraviolet (UV) portion of the electromagnetic spectrum, but also in a deep-UV portion of it. Methodologies of fabrication of such systems are judiciously defined to be compatible with CMOS.

RELATED ART

The term "optical metasurface" (interchangeably referred to below simply as "metasurface") is typically used in related art to refer to a material interface that has structures on it that impose particular phase shifts on light interacting with this material interface (that is, which is either transmitted through or reflected off the interface). In some cases, the optical metasurface may include a planar array of subwavelength electromagnetic structures that emulate the operation of a conventional, bulk refractive, birefringent, or diffractive optical component (such as, in non-limiting examples, a lens, a waveplate, or a hologram) through individually tailored amplitude, phase, or polarization transformations imposed by the metasurface on incident light with which such metasurface interacts. Several dielectric materials such as amorphous Si, polycrystalline Si, titanium dioxide or titania ($TiO_2$), and gallium nitride (GaN) have been used to realize metasurfaces operating at frequencies of infrared and/or visible light. The development of metasurfaces for applications in the ultraviolet (UV) portion of the electromagnetic spectrum, however, has been and remains to-date impeded at least by the scarcity of dielectric materials that both are characterized by low optical loss (at corresponding frequencies) and amenable to high-aspect-ratio nanopatterning. To date, the design of metasurfaces for operation in the near-UV (UV-A; free-space wavelength range: 315 nm $\leq \lambda_0 \leq$ 380 nm; energy range: 3.26 eV$\leq E_0 \leq$3.94 eV) has been attempted using niobium pentoxide ($Nb_2O_5$), demonstrating the operation down to an operation free-space wavelength of $\lambda_0$=355 nm. Crystalline Si has been used to realize metasurfaces operating at $\lambda_0$=290 nm[21], a wavelength falling within the mid-UV (UV-B; 280 nm$\leq \lambda_0 \leq$315 nm; 3.94 eV$\leq E_0 \leq$4.43 eV); in this demonstration, however, the device efficiencies were recognized to be critically limited by severe absorption loss associated with illumination frequencies above the bandgap of Si ($E_g \approx$1.1 eV). In both of the above-mentioned studies, the device functionalities that were realized in practice were restricted to hologram generation and beam deflection. And yet, the UV region (especially the deep UV region) of the optical spectrum remains a technologically important spectral regime hosting diverse application in lithography, imaging, spectroscopy, time-keeping, and quantum information processing—to name just a few—where other important optical-wavefront-shaping functionalities that can be empowered by optical metasurfaces (such as high-numerical-aperture focusing and structured beam generation, for example) have not been achieved yet.

Meanwhile, metasurfaces able to operate at even higher frequencies, such as within the deep-UV range (defined and referred to as longer wavelength portion of UV-C; 190 nm$\leq \lambda_0 \leq$280 nm; 4.43 eV$\leq E_0 \leq$6.53 eV), have not been realized due to multiple recognized challenges that include the identification of a dielectric material that has a suitably low optical absorption coefficient in that spectral range and the lack of nano-fabrication fabrication processes that would allow for successful patterning of such (not identified yet) material into high-aspect-ratio nanostructures (here, the available nano-fabrication techniques fall short in achieving this goal, as a skilled artisan well knows).

A need therefore remains to enable high-performance dielectric metasurfaces that operate over a broad UV range, including within the record-short, deep-UV portion of the optical spectrum, and that perform multiple required optical-wavefront-shaping operations or functionalities.

SUMMARY

Embodiments of the invention provide a method for fabricating a structured electromagnetic metasurface containing a sub-wavelength-scaled surface pattern. The method includes a process (conducted in an atomic layer deposition, ALD, chamber) of conformal filling an open volume—that has been created or patterned in a layer of a resist material—with a chosen target material with the use of an ALD process that is conducted at a temperature not exceeding 105° C., to define a material preform (here, the target material is selected to not include of any silicon by itself (outside of a compound or combination with another element), titania, gallium nitride, and niobium pentoxide). The method also includes a step of removing the resist material with a solvent to expose a pattern structure of the target material so dimensioned on a sub-operational-wavelength scale as to define as at least one optical element including any of refractive, diffractive, birefringent, and resonant optical elements. (The operational wavelength is predetermined in a deep-UV range of an electromagnetic spectrum.) The method may include patterning a positive tone electron-beam resist material (to form the open volume in it) and/or defining the conformally filling step of the process by depositing hafnium oxide with a Tetrakis(dimethylamino)Hafnium (TDMAH) precursor. Alternatively or in addition, the conformally filling action may include overcoating boundaries of the open volume at a top surface of the patterned layer of the resist material to form a protrusion of the target material above the top surface of the patterned layer, and the addition of a back-etching step (at which step such protrusion is removed with ion milling to yield a substantially planar top surface of the material preform). In practically any implementation of the method, the process of removing the resist material may be structured as soaking the material preform in a solvent to expose an array of columns of target material of a sub-micron height and different aspect ratios (with each aspect ratio being smaller than 11 in one case, smaller than 9 in a related implementation, smaller than 7 in yet another case, smaller than 5 in a related embodiment, and between about 3 and about 11 for various columns in the array in yet another embodiment). The aspect ratio of a respective column is defined as a ratio of a height to a spatial extent of a column in plane transverse (usually—perpendicular) to the direction along which the height is defined. Generally, the cross-section of a column in such transverse plane is defined by a polygon and/or a closed curve differentiable at any point of the curve. In any of the above-identified embodiments, the array of columns is generally structured as a periodic array with a spatial period defined—depending on the case and/or on the location of the group of columns within a boundary of such array—within a range from about 50 nm to about 500 nm. Furthermore, in substantially any implementation, the method may be additionally enhanced by at least one of the following steps: a) delivering a first vapor of a first precursor material into the ALD chamber during a time-window of a first duration to form a solid monolayer of $Hf[(CH_3)_2N]_2O$ on a surface of a chosen substrate while generating a fluid by-product $(CH_3)_2NH$(dimethylamine) substantially simultaneously with formation of such solid monolayer; b) removing a portion of the vapor of the first precursor material that has not reacted with the surface of the target material, as well as the fluid by-product from the ALD chamber by purging the ALD chamber with nitrogen; c) delivering a second vapor of liquid (in one specific case, such liquid may be water) into the ALD chamber during a time window of a second duration for create a monolayer of the target material on the surface; d) removing excess of the second vapor by purging the ALD chamber with nitrogen; and e) repeating steps a) through d) multiple times to accumulate a layer of the target material with pre-determined thickness. Such enhanced method may be additionally structured to satisfy at least one of the following conditions: i) the step of delivering the first vapor of the first precursor material may include delivering the vapor of $Hf[(CH_3)_2N]_4$ (TDMAH); ii) the target material may be $HfO_2$; iii) the fluid by-product may be a gaseous substance; and iv) the step of removing the portion of the vapor of the first precursor material may include removing the first precursor material from the ALD chamber until the remaining amount of such vapor is below detectable limits achievable with the use of electronic circuitry configured to recognize the present of the first precursor material in operation of the ALD chamber.

Embodiments of the present invention additionally provide a method for fabricating an all-dielectric metasurface optical device that includes at least one of a polarization-independent metalens, a polarization-independent metahologram, and a polarization-independent Airy beam generator. On any case, such device is formatted to have optical transmittance of at least 50% at a wavelength of 364 nm or shorter and, in a specific case—or at least 70%). The method utilizes hafnium oxide to conformally fill an open volume, formed in a patterned layer of an electron-beam resist material, with the use of an atomic layer deposition process conducted at a temperature not exceeding 105° C.

BRIEF DESCRIPTION OF THE DRAWINGS

The invention will be more fully understood by referring to the following Detailed Description of Specific Embodiments in conjunction with the Drawings, of which:

FIG. 1A: Schematic representation of a metasurface unit cell, showing a high-aspect-ratio pillar of target material having height H, an elliptical cross-section (with principle axes' lengths $D_1$ and $D_2$), and a rotation angle θ. The pillar is formed on a $SiO_2$ substrate, and multiple pillars are arranged in a square lattice or array with a sub-wavelength lattice spacing P. As discussed, specific optical functions are achieved by varying $D_1$, $D_2$, and θ as a function of nanopillar position(s) within the lattice. FIG. 1B provides a schematic representation of a specific embodiment of a low-temperature ALD cycle, configured according to the idea of the invention, which utilizes a TDMAH precursor, a $H_2O$ reactant, and a process temperature of $T_p$=95° C. FIG. 1C illustrates a refractive index n and an extinction coefficient k of as-deposited film of the target material, measured with spectroscopic ellipsometry. Values of n at the three pre-determined operational wavelengths are denoted by star-marks. Dashed line indicates position of the bandgap $E_g$ of the target material. FIG. 1D provides a scanning electron micrograph (SEM) of details of a fabricated polarization-independent metalens designed for operation at $\lambda_0$=325 nm. The structure of the metalens exhibits a lattice of 500-nm tall, circularly-shaped nanopillars of target material of varying diameters. Viewing angle: 52°. FIG. 1E: SEM of details of a fabricated spin-multiplexed metahologram designed for operation at $\lambda_0$=266 nm, showing a lattice of 480-nm tall, elliptically-shaped nanopillars of target material of varying in-plane cross-sections and rotation angles. Viewing angle: 52°. The nanopillars are coated with a layer of Au/Pd alloy (≈5 nm thick) to suppress charging during imaging.

FIG. 2A is a schematic representation of focusing by metalens (of two designs, $L_{364}$ or $L_{325}$) of normally-incident plane-wave at $\lambda_0$=364 nm and 325 nm, respectively. FIGS. 2B and 2C demonstrate cross-focus cuts and intensity distributions in the focal plane, as measured for metalenses $L_{364}$ and $L_{325}$, respectively. Theoretically predicted cross-focus cuts are plotted for reference. Scale bars: 1 μm.

FIG. 3A provides a schematic representation of the generation of a self-accelerating beam by metasurfaces ($B_{364}$ and $B_{325}$) from normally-incident plane-waves at $\lambda_0$=364 nm and 325 nm, respectively. FIG. 3B plots measured transverse defection in different z planes (ranging from 2.5 mm to 5.5 mm, with an increment of 0.5 mm) for illumination waves at respective operational wavelengths of $\lambda_0$=364 nm and 325 nm. Error bars denote one standard deviation of the measured data. The targeted beam trajectory, $d=9\ z^2$, is shown for reference. FIG. 3C illustrates an array of measured and computed xy-plane intensity distributions (normalized) at different z planes for both of $B_{364}$ and $B_{325}$ devices at their designated wavelengths of operation. Each distribution is displayed over an equal square area of side length 120 μm, but shifted along the —xy direction as a function of increasing z, such that the center of the main lobe maintains an invariant position within each image.

FIG. 4A is a schematic representation of the holographic image projection/formation by a generalized metahologram, under normally-incident plane-wave illumination at an operational wavelength. FIG. 4B includes left and right image panels. The left panel displays three theoretical (targeted) holographic images calculated to be generated by metahologorams $H_{364}$, $H_{325}$; or $H_{266}$ at $\lambda_0=364$ nm, 325 nm, and 266 mn, respectively. The tight panel displays three empirically measured holographic images projected by the implementations of the metaholograms $H_{364}$, $H_{325}$, and $H_{266}$ at the same respective wavelengths in the z=40 mm plane.

FIGS. 5A, 5B, 5C, 5D, 5E, and 5F address embodiment of a spin-multiplexed near-UV self-accelerating beam generator, FIGS. 5A, 5B provide schematic representations of the generation of a self-accelerating beam by the spin-multiplexed metasurface, $B_{364}^{spin}$, under normally-incident plane-wave having either left-hand circular polarization, LCP, or right-hand circular polarization, RCP, respectively, at the operational wavelength $\lambda_0=364$ nm. FIG. 5C provides a plot of measured -transverse defection in different z planes (ranging from 2.5 mm to 4.5 mm, with an increment of 0.5 mm) for LCP illumination of $B_{364}^{spin}$ at the operational wavelength. Error bars denote one standard deviation of the measured data. The targeted beam trajectory, d=16 $z^2$, is shown for reference. FIG. 5D illustrates measured transverse defection in different z planes (ranging from 4.5 mm to 10.5 mm, with an increment of 1.5 mm) for RCP illumination of $B_{364}^{spin}$ at the operational wavelength. Error bars denote one standard deviation of the measured data. The targeted beam trajectory, d=2.25$z^2$, is shown for reference. FIG 5E, 5F are panels illustrating measured xy-plane intensity distributions (normalized) at different z planes for the device at its designated wavelength of operation under either LCP illumination or RCP illumination, respectively. Each distribution is displayed over an equal square area of side length 140 µm, but shifted along the —xy (FIG. 5E) or xy (FIG. 5F) direction as a function of increasing z, such that the center of the main lobe maintains an invariant position within each image.

FIGS. 6A, 6B, 6C, and 6D illustrate embodiments of spin-multiplexed near- and deep-UV metaholograms. FIG. 6A provides two schematic representations of the holographic image projection by the spin-multiplexed metahologram $H_{364}^{spin}$ under LCP or RCP illumination at $\lambda_0=364$ nm, respectively. FIG. 6B includes two measured holographic images projected by the metahologram $H_{364}^{spin}$ in the z=40 mm plane under LCP illumination (top image) and RCP illumination (bottom image). FIG. 6C provides two schematic representations of the holographic image projection by the spin-multiplexed metahologram $H_{266}^{spin}$ under LCP and RCP illumination at $\lambda_0=266$ nm, respectively. FIG. 6D includes two measured holographic images projected by the metahologram $H_{266}^{spin}$ in the z=40 mm plane under LCP illumination (top image) and RCP illumination (bottom image).

FIG. 10A: Metalens $L_{364}$. FIG. 10B: Self-accelerating beam generator $B_{364}$. FIG. 10C: Metahologram $H_{364}$.

FIG. 11A: Metalens $L_{325}$. FIG. 11B: Self-accelerating beam generator $B_{325}$. FIG. 11C: Metahologram $H_{325}$.

FIG. 12 is a scanning electron micrograph (viewing angle: 20°) of selected areas of polarization-independent metahologram designed for operation at $\lambda_0=266$ nm, $H_{266}$.

FIGS. 13A, 13B are scanning electron micrographs (viewing angle: 20°) of selected areas of spin-multiplexed metasurfaces designed for operation at $\lambda_0=364$ nm. FIG. 13A: Metahologram $H_{364}^{spin}$. FIG. 13B: Self-accelerating beam generator $B_{364}^{spin}$.

FIG. 14: Scanning electron micrograph (viewing angle: 20°) of selected areas of spin-multiplexed metahologram designed for operation at $\lambda_0=266$ nm, $B_{364}^{spin}$.

FIG. 22A: a phase shift profile $\varphi_{266,LCP}^{H,spin}(x, y, \lambda_0)$ shown in FIG. FIG. 21B or FIG. 22B: a phase shift profile $\varphi_{266,RCP}^{H,spin}(x, y, \lambda_0)$ shown in FIG. 21B.

Figure 1B:
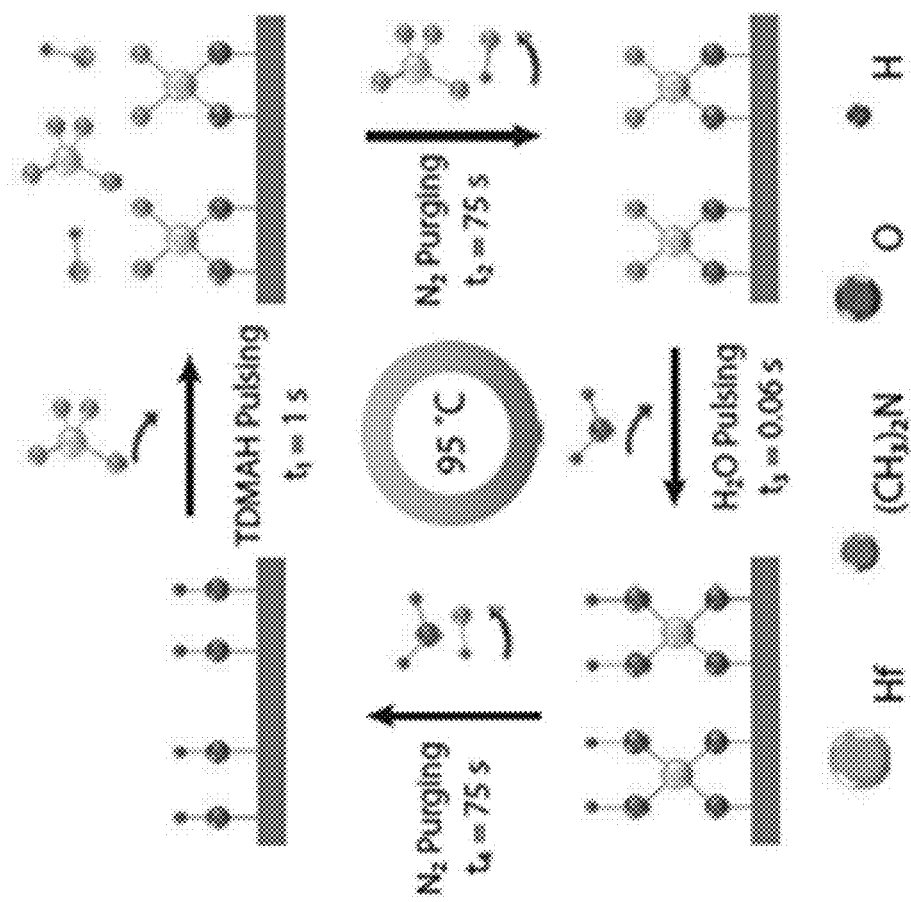
FIGS. 1A, 1B, 1C, 1D, 1E, and provide illustrations to implementations of the idea of the invention.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

The skilled artisan is well aware, therefore, that conventional target materials (such as silicon, silicon-based materials, titania, gallium nitride, niobium pentoxide, to name just a few) falls short of providing a material base for formation of metasurface optical elements—both because none of these materials simultaneously possess a suitably low optical absorption coefficient at free-space wavelengths within the deep UV and lend themselves to patterning of nanostructures with the required high-aspect ratios and sidewall straightness.

Embodiments of the present invention solved this problem by employing a target material that is free from (devoid of, does not include) any of the above-identified materials conventionally utilized for generating an optical metasurface for operation at deep UV wavelengths. Here, the following convention is used: UV-A range, or Near-UV: 315-400 nm; UV-B range, or Mid-UV: 280-315 nm; UV-C range: 100-280 nm; Deep-UV: 190-280 nm. In at least one implementation, the target material included hafnium oxide ($HfO_2$).

The use of the target material of choice, however, brought to light a different set of practical problems that manifest, in particular, in inapplicability of wet chemical etching for producing optical metasurfaces formed of this material (such non-directional etching simply cannot produce the required high-aspect ratio structural features) and in absence (lack of availability) of chemical compositions that would be suitable for directional dry-etching. These shortcoming inevitably limited the remaining choices of processing to a methodology of fabrication that generally follows the logic of a Damascene lithographic process.

To implement the embodiments of the present invention, a typical lithographic process, however, could not be used "as is"—in its conventionally-recognized form—and had to be judiciously modified in a rather subtle fashion to overcome yet another a practical problem caused by simultaneous presence of several limitations on fabrication process.

The simultaneous limitations referred to above were imposed by, on the one hand, a) geometrical dimensions (of the final metasurface structure to be formed) to enable such structure to be optically-operable in the deep-UV region, and, at the same time, b) inability of conventionally-used resist and solvent formulations to maintain spatial integrity of the structured resist templates filled and/or overcoated with the target material at temperatures of conventionally-performed ALD process(es). In particular, the former demands that physical integrity of spatial features formed in a resist template with high spatial resolution provided by electron beam lithography, ELB (a few nanometers across, for example, 4 nm or so and/or a few nanometers half-pitch extent for periodic spatially-dense features—for example, 8 nm or so) be preserved during the following plasma-free atomic-layer deposition, ALD, process. The latter, on the other hand, begs for identification and utilization of such combination of resist material(s) and ALD process in which the glass transition temperature (reflow temperature) of the resist is higher than the temperature of the ALD process to be used, as well as the use of solvents that are substantially not corrosive to the utilized resists.

Embodiments of the invention addressed this problem as well, by utilizing an alternative, an unconventional Hf precursor for thermal ALD of high-optical quality $HfO_2$ while, at the same time, at least modifying the commonly-used ALD process with the use of such precursor to have the process temperature to that generally below 105° C. (substantially the lowest glass-transition temperature of a known organic electron-beam resist) and/or modifying durations of the ALD sub-processes to ensure the completion of chemical reactions and/or full removal of excessive precursor and the ALD-reaction by-products.

Accordingly, some implementations) of the present invention utilize target materials (the materials used for fabrication of optical metasurface-based components and devices) that lend themselves as optical nano-antennas operating on the scale of a UV and/or deep-UV spectral regimes, and have such materials arranged on a surface of a chosen substrate (which, in one case, may be a planar surface). In substantially any implementation, a specific dielectric target material is used, for example hafnium oxide ($HfO_2$). In other embodiments, other dielectric materials may be suitable. In certain example embodiments, dielectric materials are selected to have a low extinction coefficient and a relatively large refractive index as compared with materials used in the visible, near-UV, or mid-UV spectral ranges, as well as material compatibility with CMOS processing.

Some specific embodiments of the present invention enable optical elements configured to perform multiple functions (such as optical multiplexing, for example, which conventional UV optical technology cannot easily provide). In various examples of embodiment described below, a spin-multiplexed hologram projection is demonstrated that operates at 364 nm (near-UV range) and 266 nm (deep-UV range), as well as spin-controlled accelerating beam generation at 364 nm.

For the purposes of this disclosure and appended claims, and unless expressly defined otherwise, the term "electromagnetic metasurface" (and, in particular, "optical metasurface") is defined as and used to refer to a planar array of artificially shaped material structures of subwavelength dimensions in height, width, and packing distance, that collectively emulate the operation of a conventional refractive, birefringent, or diffractive optical component (such as, but not restricted to, a lens, waveplate, grating or hologram), through individually tailored amplitude, phase, or polarization transformations of an incident electromagnetic wave (light).

Contriving the Material Choice and Fabrication Methodology

Figure 7:
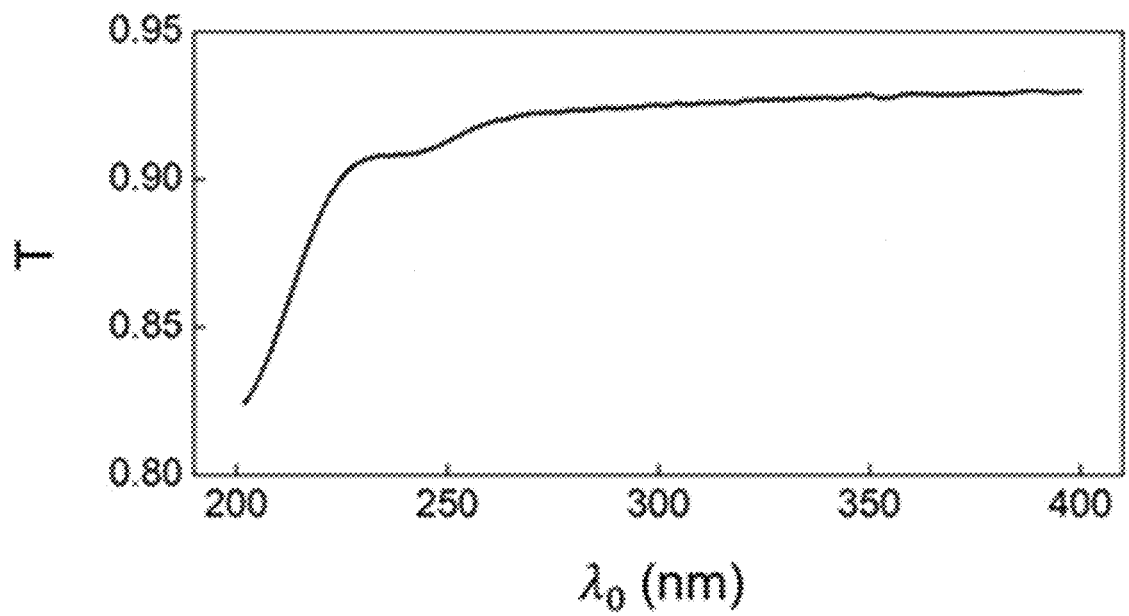
FIG. 7 is a plot of measured transmittance of a 500-µm-thick, UV-grade fused silica wafer.

In one non-limiting implementation, realized metasurface devices included of $HfO_2$ nanopillars of either circular or elliptical in-plane cross-sections (FIG. 1A), densely arrayed on a transparent UV-grade fused silica substrate of low refractive index. (As shown in FIG. 7, the 500-μm-thick, UV-grade fused silica wafer utilized as a metasurface substrate, possessed high optical transmittance in excess of 90% at each wavelength over the wavelength range of interest, about 266 nm to about 364 nm.)

The choice of $HfO_2$ as a target material—a material most commonly exploited for its high static dielectric constant as transistor gate insulator in complementary metal oxide semiconductor (CMOS) integrated circuits—was guided by the promise of both a large refractive index (n>2.1 for $\lambda_0$<400 nm) and a wide bandgap $E_g$=5.7 eV ($\lambda_0$=217 nm) corresponding to a wavelength well within the deep-UV spectral region, thereby leading to a negligible extinction coefficient (k≈0) at wavelength(s) $\lambda_0 \geq \lambda_g$. Though the requirement of nanopillar dimensions of wavelength-scale height several hundred nanometers), subwavelength-scale in-plane circle diameter or ellipse minor axis (~few tens of nanometers), and vertical sidewalk suggest that pattern transfer with a directional dry-etching technique such as reactive ion etching would be optimal, it was empirically verified that a suitable dry-etch chemistry for $HfO_2$ (a material commonly patterned by non-directional wet chemical etching) could not be identified. Instead, an embodiment of the process for patterning structured around the use of Damascene lithography for $HfO_2$ metasurface fabrication was implemented. Specifically, a foundation of the processing method was turning on first patterning the resist template using one of available processes (for example an electron beam lithography, or e-beam lithography, or EBL); then conformally filling the open volumes/voids of the resist template with the material of choice (the target material) using atomic layer deposition, ALD—this step including the over-coating or over-deposition of the material of choice above the upper level of the open void(s) to ensure the spatial continuity of the material of choice within the void(s) and complete filling of the voids with the material of choice. The over-coated portion of the target material above the upper level of the so-filled void(s) was then back-etched with the use of an Ar-ion milling procedure, followed by removing the volume(s) of remaining resist in the resist template with solvent (to leave the required high-aspect-ration nanopillars).

Figure 1A:
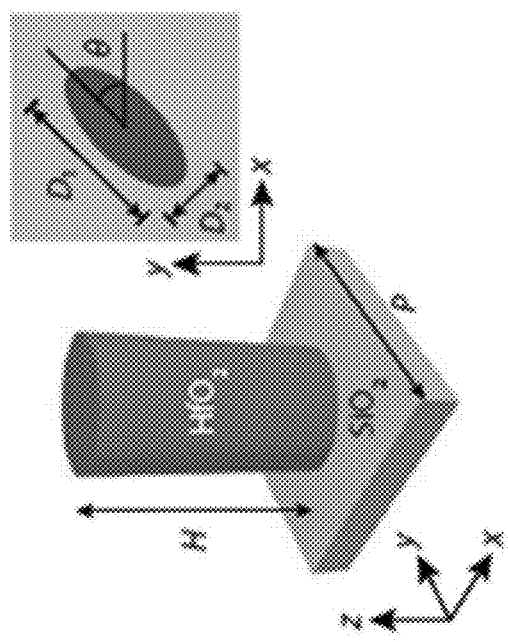
Figure 1C:
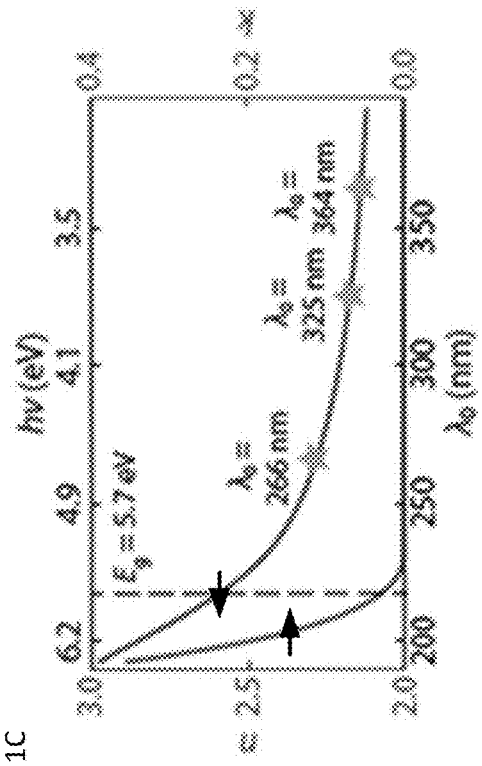

Preservation of or maintaining the physical/structural integrity of the resist template (that is, preventing the resist template from changing its shape or form during the fabrication process), however, was empirically proven to be frustrated and not ensured when conventionally-defined Damascene lithography was used. Normally, maintaining the structural integrity of the used resist required use of a plasma-free thermal ALD process characterized by a process temperature, $T_p$, that is lower than the glass transition temperature (reflow temperature) of the utilized resist, $T_g$, along with a process chemistry having by-products that are not corrosive to the resist. Therefore, as a skilled artisan will now readily appreciate, fulfilling both process tolerance requirements ruled out the use of common Hf precursors such as Tetrakis(ethylmethylamino)Hafnium (TEMAH), for which the minimum $T_p$(≈150° C.) is significantly greater than the $T_g$ of common electron beam (e-beam) resists; or Hafnium Chloride ($HfCl_4$), for which the reaction by-product (HCl) attacks the resist. To address these problems, a new solution was required and found in utilizing Tetrakis (dimethylamino)Hafnium (TDMAH) as an alternative Hf precursor for thermal ALD of high-optical-quality $HfO_2$, that has a $T_p$ below that of the $T_g$ of common e-beam organic resists (such as ZEP, for which $T_g$≈105° C.). Furthermore, to avoid the risk of incomplete reaction cycles and physical condensation of precursors associated with low-temperature ALD (yielding films having defects and voids, and hence, degraded sub-bandgap optical properties, such as reduced refractive index n and finite extinction coefficient k), an existing ALD process using TDMAH and $H_2O$ precursors and operating at $T_p$=200° C. was additionally modified (as schematically illustrated in FIG. 1B by (1) decreasing the process temperature to a temperature below 105° C. (in one non-limiting specific case, $T_p$=95° C. was set); (2) increasing the TDMAH pulsing time, $t_1$, from 0.25 s to 1 s, to enable a complete reaction with the OH monolayer resulting from the previous cycle; and (3) increasing $N_2$ purging times, $t_2$ and $t_4$, from 12 s to 75 s, to ensure a substantially full removal (that is, removal down to the level below the detection level of the available detecting electronic circuitry) of excessive precursors and reaction by-products (see additional details in the Supplemental information, Section I below). As revealed by spectroscopic ellipsometry measurements (FIG. 1C; see also Supplementary information, Section II below), hafnium oxide films deposited using the so judiciously-modified low-temperature ALD process are characterized by a high refractive index (n>2.1) and negligible optical loss (k≈0), over an UV wavelength interval 220 nm≤$\lambda_0$≤380 nm spanning the full mid- and near-UV ranges, as well as more than half of the deep-UV range. In FIG. 1C, values of n at the three operational wavelengths targeted in this example are denoted by star-shaped marks. Dashed line indicates position of $HfO_2$ bandgap $E_g$. The measured wavelength dependences of n and k closely match those of a film grown using the 200° C. reference ALD process (Supplementary Information, FIG. S3), demonstrating that the optical quality of the deposited $HfO_2$ can be maintained at significantly lower ALD process temperatures with choice of a suitable Hf precursor and proper adjustment of pulsing and purging times. Such non-trivial modifications to the conventional ALD process have not been considered before in related art, and allowed the continued use of the ZEP-type resist traditionally employed in EBL for generating a resist template.

Figure 1D:
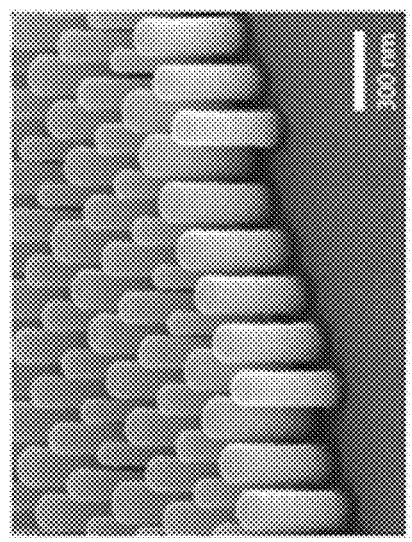
Figure 1E:
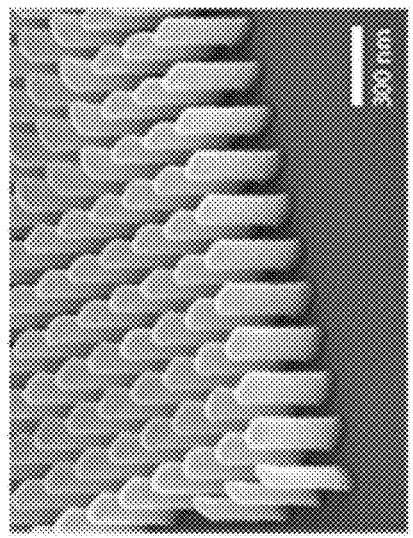
Figure 1F:
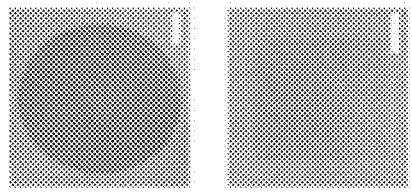
FIG. 1F provides optical micrographs of full a metalens (in a top panel) and a spin-multiplexed metahologram (in a bottom panel), corresponding respectively, to metasurfaces described in FIGS. 1D and 1E. Scale bars: 100 μm.

As a result, utilization of the ZEP resist and the novel low-temperature TDMAH-based ALD process for deposition of the target material (in the described example—hafnium oxide), the proposed modified fabrication process was applied to yield substantially defect-free metasurfaces each exhibiting large arrays of densely packed $HfO_2$ nanopillars on a UV-grade fused silica substrate. FIGS. 1D, 1E, and 1F provide illustrations to typical results of the employed novel processing methodology. In this non-limiting example, FIG. 1F contains two optical micrographs—the upper of a full metalens and a lower of a spin-multiplexed metahologram, while enlarged views of contents of these metasurfaces are shown, respectively, in FIGS. 1D and 1E. As can be seen, constituent nanopillars have uniform height, circular (FIG. 1D) or elliptical (FIG. 1E) in-plane cross sections, and are characterized by straight, vertical and smooth sidewall (see also FIGS. 10A, 10B, 10C, 11A, 11B, 11C, 12, 13A, 13B, and 14). The nanopillar rotation angle and two principal axes' lengths in the plane of the metasurfaces (respectively, θ, $D_1$, and $D_2$, where θ=0 and $D_1$=$D_2$=D in the case of a circular cross-section, in reference to FIG. 1A), vary as a function of nanopillar position at the corresponding metasurface (with 0≤θ≤π and 50 nm≤($D_1$, $D_2$)≤160 nm) depending on the particular optical function implemented by the corresponding metasurface. The nanopillar height H varies depending on the operational wavelength for operation at which a given metasurface is fabricated (in the examples of FIGS. 1D, and 1E: 400 nm≤H≤550 um).

Accordingly, embodiments of the invention provide a method for fabricating a structured electromagnetic metasurface containing a sub-wavelength-scaled surface pattern. Such method includes utilizing an ALD chamber to conformally fill an open volume formed in a patterned layer of a resist material with a target material with the use of an ALD process conducted at a temperature not exceeding 105° C. to define a material preform. (The used target material devoid of any of silicon, silicon-containing compounds, titania, gallium nitride, and niobium pentoxide). The method further includes a step of removing the resist material with a solvent to expose the sub-wavelength-scaled pattern structure of the target material. Here, the resulting pattern structure is dimensioned to operate as at least one of refractive, diffractive, birefringent, and resonant optical elements at a wavelength defined in a deep-UV range of an electromagnetic spectrum. In a specific case, the process of conformally filling includes depositing hafnium oxide with a Tetrakis (dimethylamino)Hafnium (TDMAH) precursor and/or overcoming boundaries of the open volume at a top surface of the patterned layer of the resist material to form a protrusion of the target material above the top surface of the patterned layer. In the latter case, the process additionally includes a step of back-etching such protrusion with ion milling to yield a substantially planar top surface of the material preform.

In one implementation, the method includes at least one of the following steps: (a) delivering a first vapor of a first precursor material into the ALD chamber in a during a time-window of a first duration to form a solid monolayer of $Hf[(CH_3)_2N]_2O$ on a surface of a chosen substrate while generating a fluid by-product $(CH_3)_2NH$(dimethylamine) simultaneously with formation of said solid monolayer; (b) removing a portion of the vapor of the first precursor material that has not reacted with the surface of the target material and the fluid by-product from the ALD chamber as a result of purging the ALD chamber with nitrogen gas; (c) delivering a second vapor of liquid into the ALD chamber during a time window of a second duration for create a monolayer of the target material on the surface; (d) removing excess of the second vapor by purging the ALD chamber with nitrogen; and (e) repeating steps a) through d) multiple times to accumulate a layer of the target material having a pre-determined thickness on the surface.

Non-Limiting Examples and Implementations

Initially, as discussed below, we demonstrated the fabrication of lenses, self-accelerating beam generators, and holograms (based on polarization-independent metasurfaces with nanopillars of in-plane circular cross-sections) that operate at near-UV wavelengths of 364 nm and 325 nm (which wavelengths correspond to emission lines of an argon-ion and a helium-cadmium laser, respectively) with efficiencies (measured in terms of optical transmittance) up to 72%. Further exploiting the high patterning fidelity of the newly-devised processing technique and leveraging the negligible optical loss of the as-deposited $HfO_2$ dielectric material across most of the ultraviolet regime, critical dimensions of metasurfaces were scaled to realize polarization-independent holograms operating at a deep-UV wavelength of 266 nm (which wavelength corresponds to the emission line of an optical parametric oscillator pumped by a nanosecond Q-switched Nd:YAG laser), moreover with relatively high efficiencies (or optical transmittance values, greater than 50%, and even greater than 60% in different cases). Finally, by opening up the design space with the three degrees of freedom (parameters $\theta$, $D_1$, and $D_2$, see FIG. 1A) provided by elliptically-shaped nanopillars compared to the only, single degree of freedom (parameter D, see FIG. 1A) allowed by circularly-shaped nanopillars, we realize spin-multiplexed metasurfaces that impart independent phase shift profiles to light emerging from the device, under illumination with left-handed circularly-polarized (LCP) or right-handed circularly-polarized (RCP) light, respectively, The implemented self-accelerating beam generators and spin-multiplexed metaholograms operate at UV wavelengths of 364 nm and 266 nm, respectively, with efficiencies up to 61%. For the purposes of this disclosure and appended claims, and unless expressly defined otherwise, the self-accelerating beam is defined as a propagation-invariant optical wave a main intensity lobe of which propagates along a predefined trajectory while the wave itself is resilient to perturbations applied thereto and does not diffract upon propagation. (One of the best known in the art self-accelerating beams is the Airy beam that propagates along a parabolic trajectory while preserving its amplitude structure substantially unchanged during such propagation.)

Examples of Polarization-Independent Ultraviolet Metasurfaces

Each of the examples of implemented polarization-independent metasurfaces (those configured as a lens, a self-accelerating beam generator, and a hologram) was structured as a square lattice or array of $HfO_2$ cylindrical nanopillars. The diameters of these pillars vary as a function of the pillar position within the lattice/array. Each nanopillar is configured to act as a truncated dielectric waveguide with top and bottom interfaces of low reflectivity, through which light propagates with transmittance and phase shift controlled by the pillar height H, pillar diameter D, and lattice spacing (that is, spatial separation between and among the constituent pillars) P. For each targeted operational wavelength (the non-limiting examples: $\lambda_0$=364 nm, 325 nm, and 266 nm), a corresponding pillar height (H=550 nm, 500 nm, and 400 nm, respectively) and sub-wavelength lattice spacing (P=200 nm, 190 nm, and 150 nm, respectively) were chosen in specific non-limiting implementations, along with a range of pillar diameters that yield phase shifts varying over a full range of $2\pi$, while maintaining a relatively high and constant transmittance ([50 nm, 160 nm], [50 nm, 150 nm], and [50 nm, 110 nm], respectively). The detailed design procedure is elaborated in Supplementary Information, Section IV.

Figure 2C:
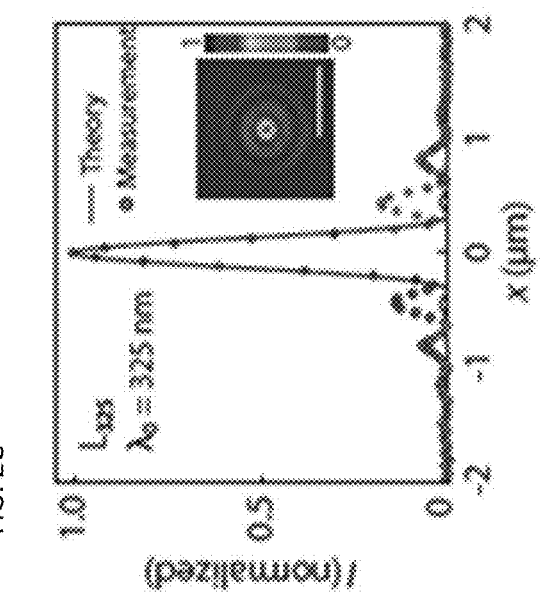
FIGS. 2A, 2B, and 2C illustrate implementations of polarization-independent near-UV metalenses.
Figure 2B:
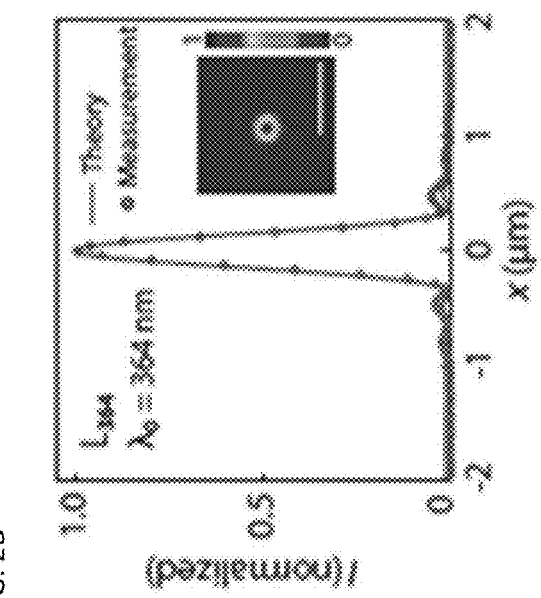
Figure 2A:
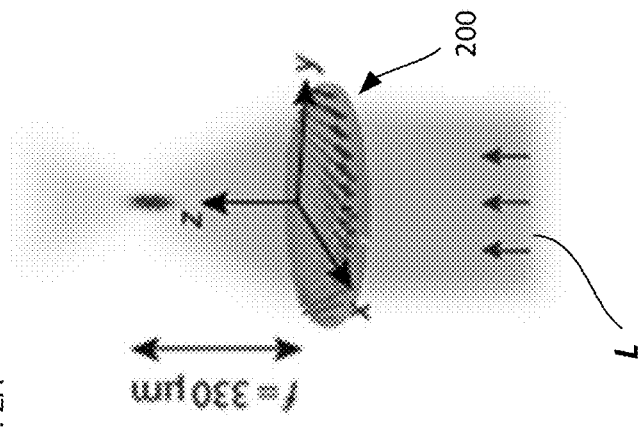

Example 1: As a first demonstration of polarization-independent UV metasurfaces, two 500-μm-diameter, polarization-independent metalens designs, $L_{364}$ and $L_{325}$, of substantially equal numerical apertures NA=0.6 (corresponding to focal lengths $f$=330 μm), were implemented for focusing ultraviolet light at respective free-space wavelengths $\lambda_0$=364 nm and 325 nm (see the schematic of FIG. 2A). Single-mode focusing of an incident onto the metalens 200 plane wave L was achieved by implementing the radially-symmetric phase shift function $\varphi^L(x, y, \lambda_0)$=mod $((2\pi/\lambda_0) (f-\sqrt{x^2+y^2+f^2}), 2\pi)$, where $f$ is the focal distance normal to the plane of the lens 200 (along the z direction), x and y are in-plane distances along orthogonal directions from the center of the lens 200, and normal incidence is assumed. As shown in FIGS. 2B, 2C, each intensity distribution measured at the metalens focal plane (see also Supplementary Information, Section V) revealed a substantially circularly-symmetric focal spot, characterized by a cross-section that closely matched the intensity distribution theoretically predicted for a diffraction-limited lens of numerical aperture NA=0.6 and given by the Airy disk function $I(x)=[2J_1(A)/A]^2$, where $J_1$ is the Bessel function of the first kind of order one, and $A=2\pi NAx/\lambda_0$. The focusing efficiencies, defined as the ratio of the optical power of the focused spot to the total power illuminating the metalens, were (55.17±2.56) % (for lens $L_{364}$) and (56.28±1.37) % (for lens $L_{325}$). The cited uncertainties represent one standard deviation of the measured data.

Figure 3B:
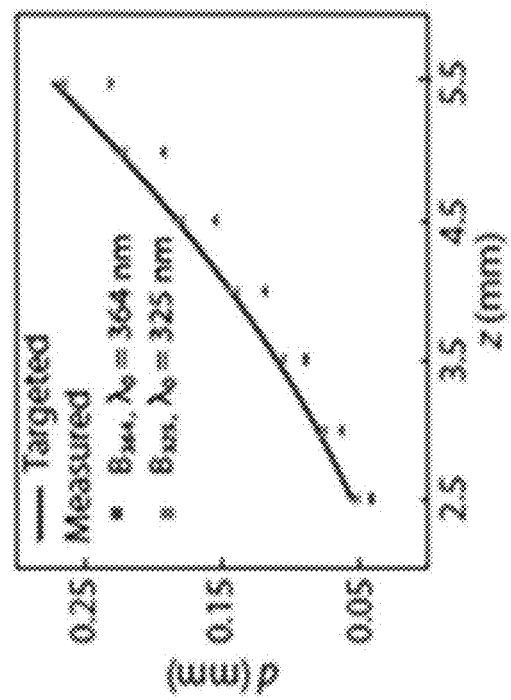
FIGS. 3A, 3B, and 3C illustrate embodiments of polarization-independent near-UV self-accelerating beam generators.
Figure 3A:
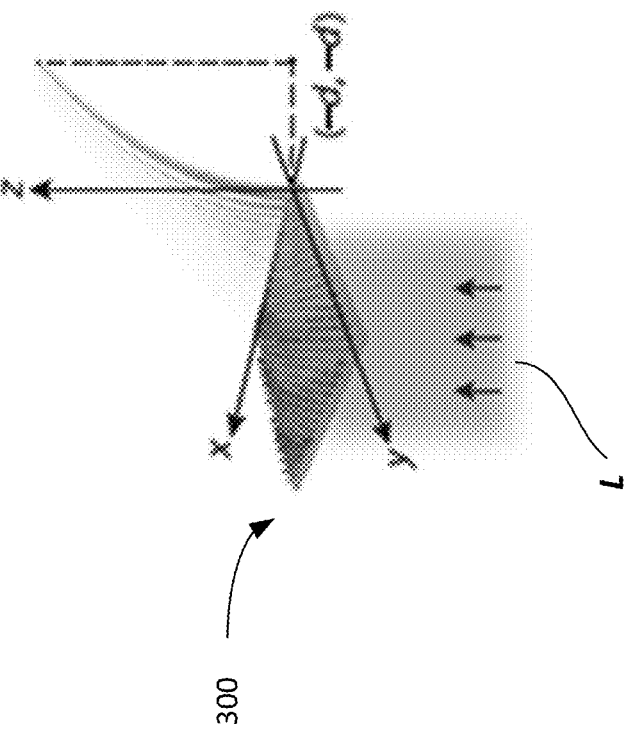

Example 2 illustrates creating of polarization-independent metasurfaces configured to transform a normally-incident, plane wave L into a diffraction-free output beam propagating along a curved trajectory, i.e., a self-accelerating beam (SAB). Here, two designs,($B_{364}$ and $B_{325}$), for a $_{270}$-µm-square SAB generator were implemented to operate at the respective wavelengths of 364 nm and 325 nm, see FIGS. 3A, 3B.). The SAB generator design and operation are conveniently described using a Cartesian coordinate system in which the constituent metasurface 300 is located in the z=0 plane and the 1st xy quadrant, with one corner positioned at the origin. The implemented SAB for each targeted free-space wavelengths $\lambda_0$=364 nm and 325 nm, was characterized by a L-shaped wave-packet of main lobe centered on the trajectory $y=x=-az^2$, where a=9 m$^{-1}$ (in other words, originating from (0, 0, 0), propagating in the +z direction in a curved trajectory confined to the plane y=x, with a height above the surface given by $z=\sqrt{d/a}$, where d=|x|=|y| is the lateral displacement). The targeted SAB was generated by implementing a phase-shift profile $\varphi^B(x, y, \lambda_0)$=mod ( $$-\frac{8\pi}{3\lambda_0}\sqrt{a}\left(x^{\frac{3}{2}}+y^{\frac{3}{2}}\right),$$

Figure 3C:
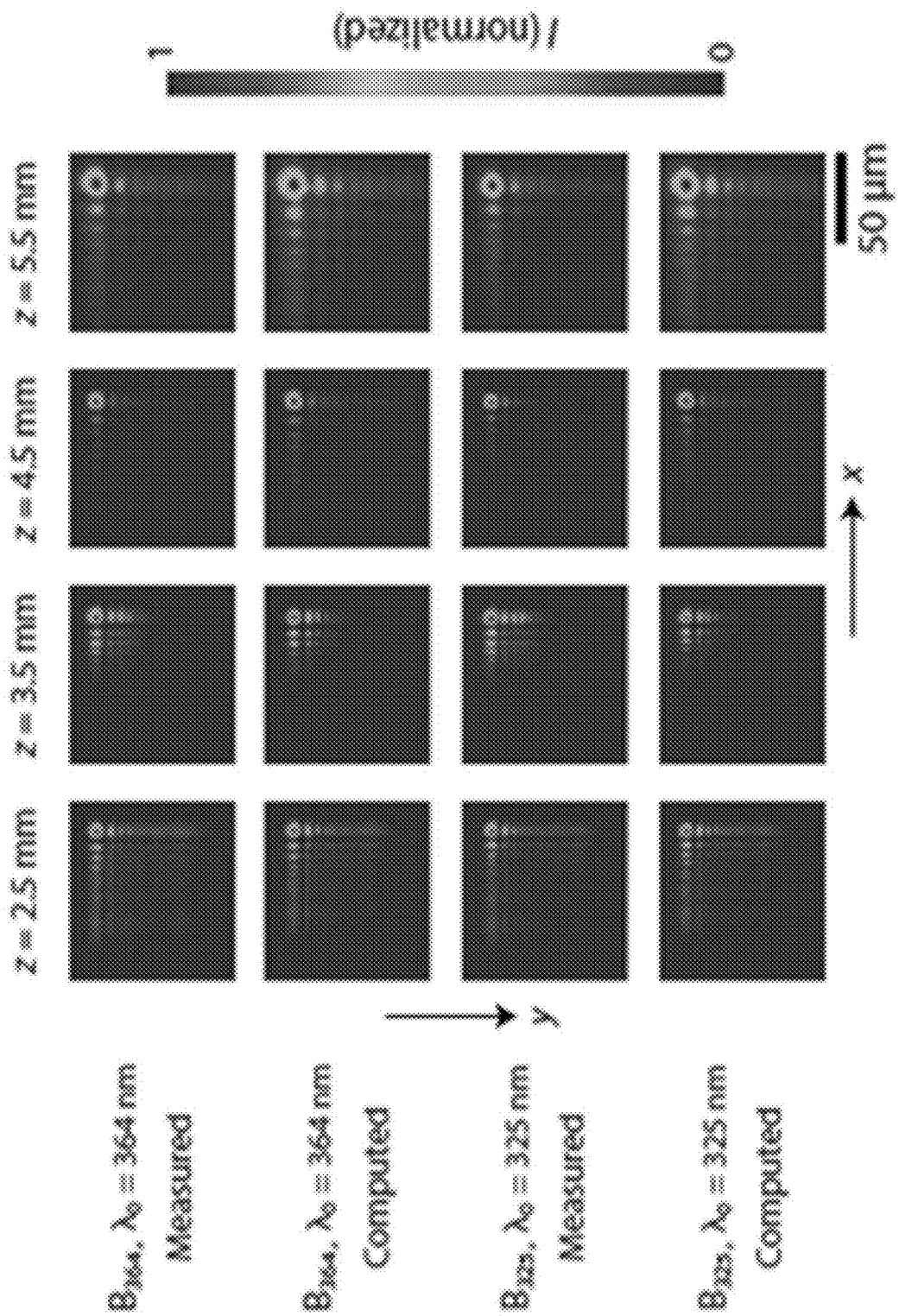

$2\pi$) in the metasurface. The measured lateral displacement values d(z) awere observed to closely match, in each case, the calculated values based on the targeted trajectory (FIG. 3B; see also Supplementary Information, Section VI). As illustrated in FIG. 3C, the experimental SAB generated by each implemented device exhibited substantially diffraction-free characteristics with xy-plane intensity distributions similar to the intensity distributions numerically computed using the angular spectrum representation method (assuming an ideal metasurface realization having both the designed phase shift profile $\varphi^B$ and unity transmittance T). The measured efficiencies, defined as the ratio of the total optical power of the SAB in the z=5 mm plane to the total power illuminating the metasurface, were (46.75±2.31) % (for design $B_{364}$) and (67.42±4.43) % (for design $B_{325}$). These efficiencies compared favorably to that reported in related art TiO$_2$-based self-accelerating beam generator operating at visible frequencies (Fan et al., in *Nano Lett.* 2019, 19, 1158-1165; incorporated herein by reference).

Figure 4B:
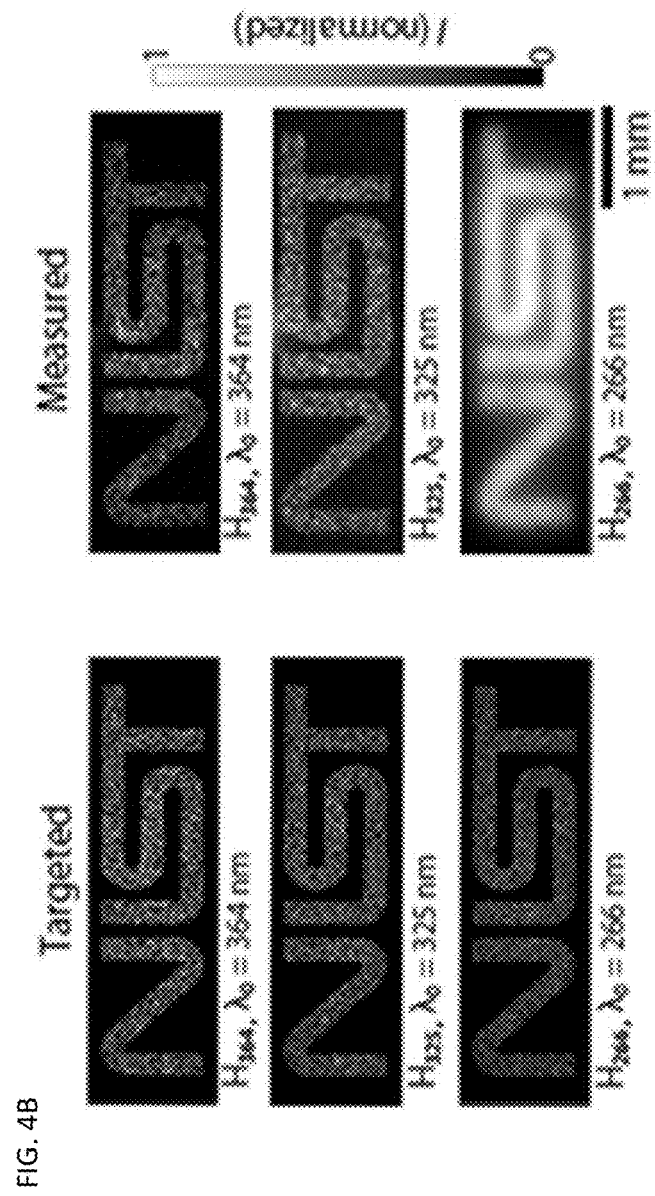
FIGS. 4A, 4B illustrate embodiments of polarization-independent near- and deep-UV metaholograms structured according to designs $H_{364}$, $H_{325}$, and $H_{266}$.
Figure 4A:
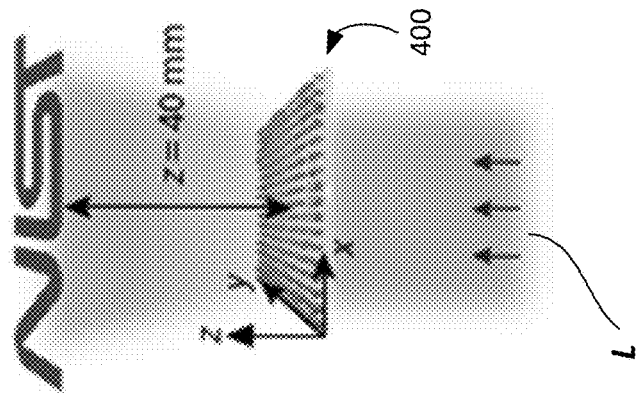

Example 3: As a final demonstration of polarization-independent UV metasurfaces, three metaholograms, denoted $H_{364}$, $H_{325}$, and $H_{266}$ and operating at three respective UV wavelengths $\lambda_0$=364 nm, 325 nm, and 266 nm were fabricated (see the schematic of FIG. 4A). Each metahologram 400, which occupied a square area of side length 270 µm, was mapped to a Cartesian coordinate system in which the constituent metasurface was positioned in the z=0 plane and the 1st xy quadrant, with one corner at the origin. The Gerchberg-Saxton algorithm (*Optik*, vol. 35, No. 2, pp. 237-246, 1972; incorporated herein by reference) was employed to calculate the required phase shift profile $\varphi^H_{364}$ (x, y, $\lambda_0$), $\varphi^H_{325}$(x, y, $\lambda_0$), and $\varphi^H_{266}$(x, y, $\lambda_0$) for producing a holographic image "NIST" formed in the z=40 mm plane, under normal-incidence, plane-wave illumination L (see Supplementary information, Section VII). An additional offset of y=−3 mm was added to avoid overlap of the generated holographic image with the residual directly transmitted beam. The images projected by metaholograms $H_{364}$, $H_{325}$, and $H_{266}$ were measured (Supplementary Information, Sections VIII and IX) and now displayed in FIG. 4B, right panel. Each of the experimental holographic images faithfully replicated the shape of the corresponding target image (illustrated in the left panel of FIG. 4B). The target images were numerically computed assuming an ideal metahologram realization having both the designed phase shift profile $\varphi^H$ for a given operation wavelength and unity transmittance T. In addition, the speckle patterns filling the shapes of the measured images projected by metaholograms $H_{364}$ and $H_{325}$ presented numerous similarities to those of the corresponding target images; the as-measured holographic image projected by metahologram $H_{266}$ did not offer the possibility of such a comparison due to the employed fluorescence transduction characterization scheme, which washed out the details of the speckle patterns. The measured efficiencies for metaholograms $H_{364}$ and $H_{325}$, defined as the ratio of the total optical power of the holographic image to the total power illuminating the structure, are (62.99±4.14) % and (71.78±2.06) %, respectively. The measured efficiency for metahologram $H_{266}$, defined as the ratio of the total fluorescence power of the holographic image to the fluorescence power of light illuminating the structure (Supplementary Information, Section IX), were (60.67±2.60) %. These efficiency values were comparable to those of recently reported TiO$_2$-based metaholograms operating in the visible portion of the optical spectrum (see Devlin et al., in PNAS, Sept. 20, 2016, vol 113, no. 38, pp 10473-10478; published at www.pnas.org/cgi/doi/10.1073/pnas.1611740113; incorporated herein by reference).

Examples of Spin-Multiplexed Ultraviolet Metasurfaces

While metasurfaces operating to switch between distinct optical outputs, such as different holographic images, or differently oriented beams, under the control of fundamental optical state of the input beam (such as polarization), or a spatial feature of the input beam (such as angle of incidence) have been demonstrated, the related art has not presented any methodology to-date to implement spin-multiplexed UV metasurfaces structured to switch between distinct outputs depending on the handedness of input light (left-hand circularly polarized-LCP or right-hand circularly polarized-RCP). Embodiments of the current invention made such metasurfaces possible for the first time. The detailed design procedure is elaborated in Supplementary Information, Section X.

Example 4: In particular, utilizing the proposed processing methodology, an embodiment of a polarization-dependent, spin-multiplexed self-accelerating beam generator operating at $\lambda_0$=364 nm and referred to as $B_{364}^{spin}$ was realized. In reference to the schematic illustration of FIGS. 5A and 5B, the embodiment 500 of the $B_{364}^{spin}$ self-accelerating beam generator was configured to generate SABs following different trajectories under the control of the handedness of circularly-polarized incident light. The spin-multiplexed SAB generator, which occupies a square area of side length=330 µm, was referenced to a Cartesian coordinate system in which the constituent metasurface is located in the z=0 plane and the 1st xy quadrant, with one corner positioned at the origin. Two distinct phase shift profiles, $\varphi^{LCP}$ (x, y, $\lambda_0$)=mod ( $$-\frac{8\pi}{3\lambda_0}\sqrt{16}\left(x^{\frac{3}{2}}+y^{\frac{3}{2}}\right),$$

$2\pi$) and $\varphi^{RCP}$(x, y, $\lambda_0$)=mod ( $$-\frac{8\pi}{3\lambda_0}\sqrt{2.25}\left((l-x)^{\frac{3}{2}}+(l-y)^{\frac{3}{2}}\right),$$

$2\pi$), were targeted for device operation, in order to yield SABs exiting the metasurface from opposite corners and following different trajectories, y=x=−$d_1$=−1.6 $z^2$, and (y−l)=(x−l)=$d_2$=2.25 $z^2$, under LCP and RCP illumination, respectively (as shown by 510 and 512 in FIGS. 5A, 5B), The measured lateral displacement values, $d_1$(z) and $d_2$(z), were observed to closely match, in each case, the calculated values based on the targeted trajectory (illustrated by respective plots of FIGS. 5C, 5D). The experimental SAB generated by the device exhibited diffraction-free characteristics with icy-plane intensity distributions (shown in FIGS. 5E, 5F) similar to the targeted intensity distributions (discussed in Supplementary Information, Section XI). The targeted distributions, in turn, were numerically computed assuming an ideal metasurface realization having both the designed phase shift profile $\varphi^{LCP}$ ($\varphi^{RCP}$) and unity transmittance T. The measured efficiency under LCP illumination [or RCP illumination, respectively]), defined as the ratio of the total optical power of the SAB in the z=4.5 mm [or z=10.5 mm] plane to the total power illuminating the metasurface, was (38.42±1.95) % [or (61.90±2.03) %]. The efficiency of the beam generator under LCP illumination, that was lower than that demonstrated under RCP illumination, could be attributed to challenges associated with implementing a phase shift profile of higher spatial gradient.

Figure 19A:
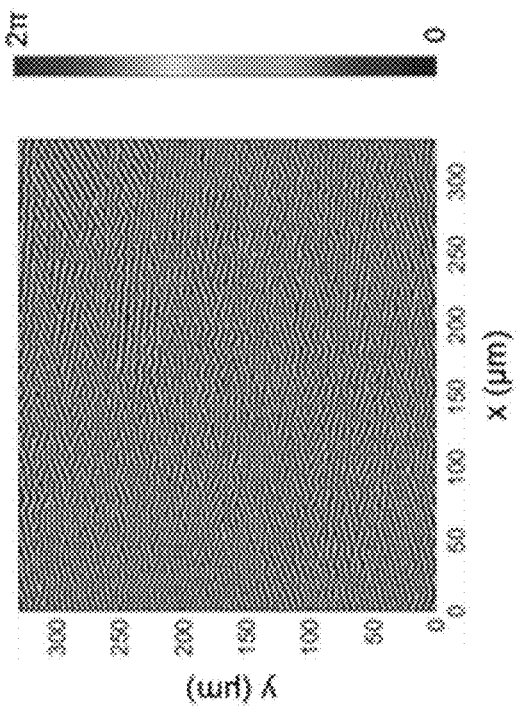
FIGS. 19A, 19B depict metasurface phase shift profiles, $\varphi_{364,LCP}^{spin}(x, y, \lambda_0)$ and $\varphi_{364,RCP}^{H,spin}(x, y, \lambda_0)$, designed to project a "NIST" (FIG. 19A) and "NJU" (FIG. 19B) holographic images to the z=40 mm plane, under normally-incident, plane-wave illumination at $\lambda_0=364$ nm (implemented by spin-multiplexed metahologram $H_{364}^{spin}$).
Figure 19B:
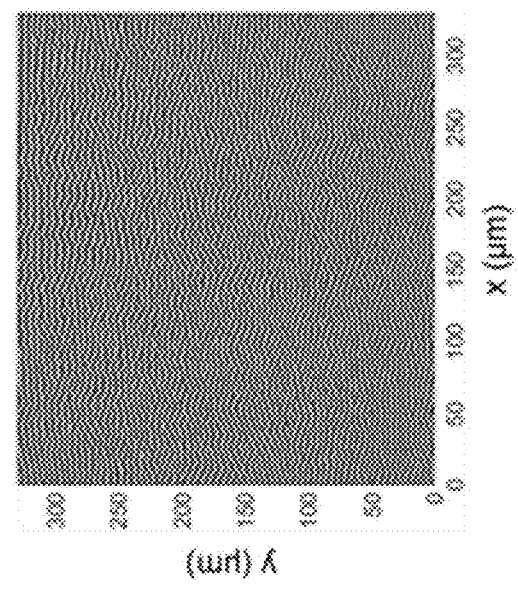
Figure 20A:
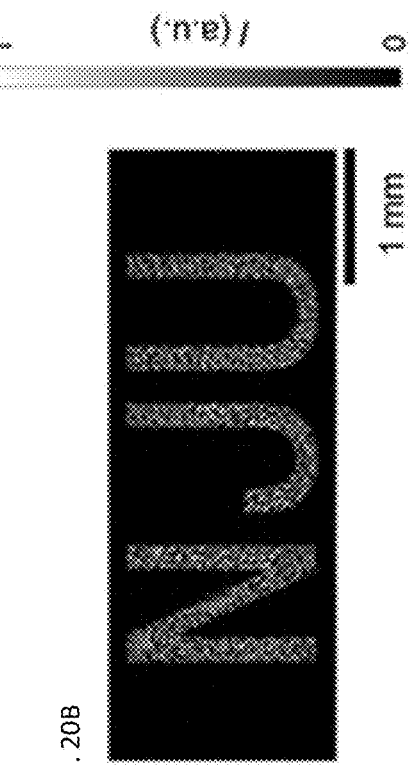
FIGS. 20A, 20B are targeted holographic images in the z=40 mm plane, numerically computed assuming an ideal metahologram realization having a unity transmittance. The targeted image of FIG. 20A has a phase shift profile $\varphi_{364,LCP}^{H,spin}(x, y, \lambda_0)$ of FIG. 19A. The targeted image of FIG. 20B has a phase shift profile $\varphi_{364,RCP}^{H,spin}(x, y, $\lambda_0$) of FIG. 19B. A normally-incident plane-wave illumination at $\lambda_0$=364 nm was assumed.
Figure 20B:
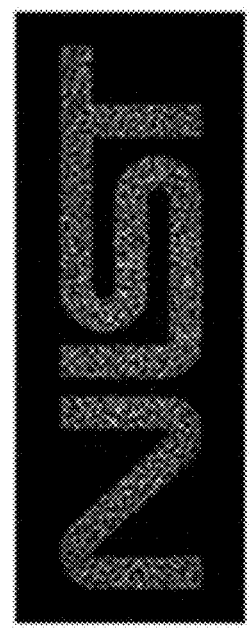

Example 5 demonstrates a spin-controlled metahologram operating at the same near-UV wavelength of 364 nm. In reference to FIG. 6A (displaying two related images), the implementation 600 of a 330-µm-square metahologram, $H_{364}^{spin}$, located in the z=0 plane, was designed to project a holographic "NIST" image (for LCP illuminating light) and "NJU" image (for RCP illuminating light) at $\lambda_0$=364 nm, all located in the xy-plane at z=40 mm, with an offset of y=−3. Corresponding phase shift profiles are illustrated by plots discussed in Supplementary Information, Section XII, FIGS. 19A, 19B). Both experimentally captured holographic images shown in FIG. 6B correctly replicate the shape of the corresponding targeted images computed from the designed phase profiles, including some fine grain details (as discussed in Supplementary Information, Section XII, FIGS. 20A, 20B). The measured efficiencies, defined as the ratio of the total optical power of the holographic image to the total power illuminating the metahologram, were (54.02±2.22) % (under LCP illumination) and (53.76±2.42) % (under RCP illumination), respectively.

Figure 21A:
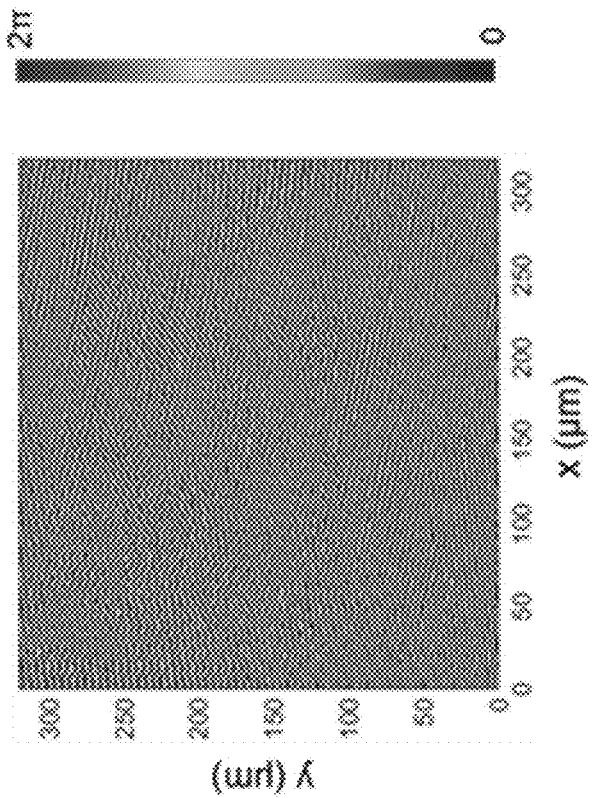
FIGS. 21A, 21B illustrate metasurface phase shift profiles, $\varphi_{266,LCP}^{H,spin}(x, y, \lambda_0)$ and $\varphi_{266,RCP}^{H,spin}(x, y, \lambda_0)$, designed to project a "deep" (FIG. 21A) and "UV" (FIG. 21B) holographic images to the z=40 mm plane, under normally-incident plane-wave illumination at $\lambda_0$=266 nm (implemented by spin-multiplexed metahologram $H_{266}^{spin}$).
Figure 21B:
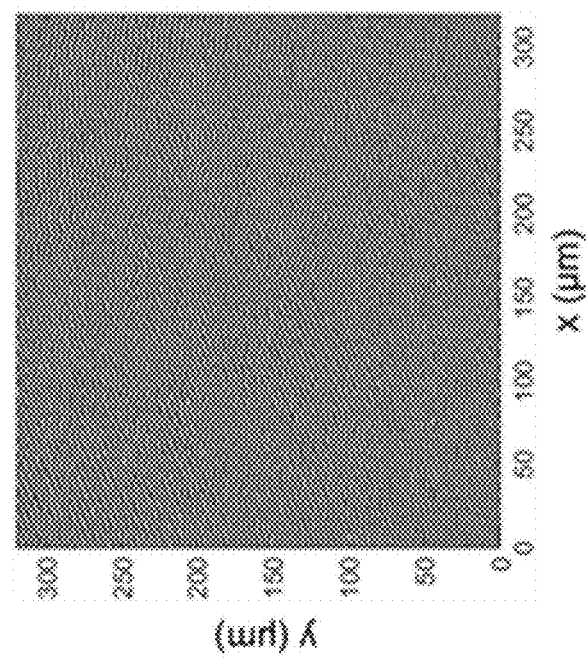
Figure 22A:
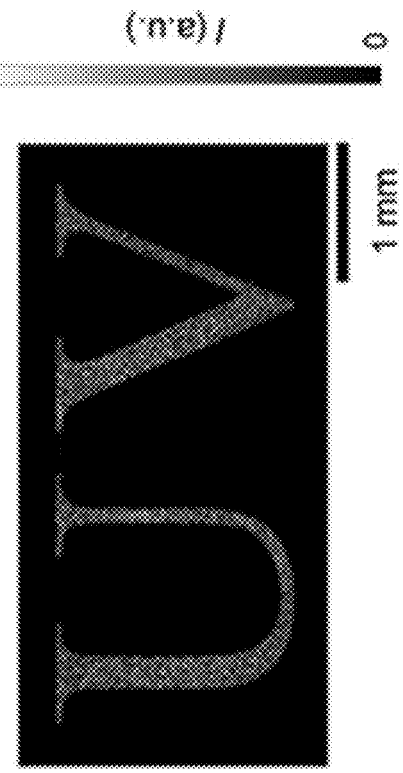
FIGS. 22A, 22B illustrate targeted holographic images in the z=40 mm plane, numerically computed assuming i) normally-incident plane-wave illumination at $\lambda_0$=266 nm, ii) an ideal metahologram realization having a unity transmittance, and iii)
Figure 22B:
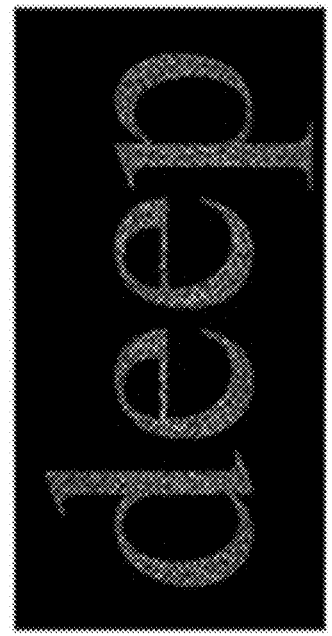

Example 6: Yet in another related embodiment 650, a spin-multiplexed metahologram, $H_{266}^{spin}$, occupying a square area of side length of 320 µm, was demonstrated to operate at the deep-UV wavelength of 266 nm. The device, located in the z=0 plane, was designed to project, at $\lambda_0$=266 nm, a holographic "deep" image for LCP illumination and a holographic "UV" image for RCP illumination, where the targeted location for each of these images was defined as z=40 mm plane with a lateral offset of y=−3 mm (see FIG. 6C). Corresponding phase shift profiles are plotted in Supplementary Information, Section XIII, FIGS. 21A, 21B). In practice, each of the experimental holographic images, displayed in panels of FIG. 6D, faithfully replicated the shape of the corresponding target image (Supplementary Information, Section XIII, FIGS. 22A, 22B), including subtle details of the chosen font, such as linewidth variation and serif. The measured efficiencies, defined as the ratio of the total fluorescence power of the holographic image to the fluorescence power of light illuminating the structure, were (58.95±1.95) % under LCP illumination, and (61.23±1.49) % under RCP illumination.

A person of ordinary skill in the art readily appreciates that metasurface-based systems containing a combination of one or more of the above-described metasurface devices can be produced with embodiments of the invention. Therefore, as disclosed in the above Examples, embodiments of the invention provide a method for fabricating an all-dielectric metasurface optical system (that includes at least one of a polarization-independent metalens, a polarization-independent metahologram, and a polarization-independent Airy beam generator; with devices in such system having optical transmittance of at least 50% at a wavelength of 364 nm or shorter). The method utilizes hafnium oxide to conformally fill an open volume; formed in a patterned layer of an electron-beam resist material, using an atomic layer deposition conducted at a temperature not exceeding 105° C. In a specific implementation of the method, the utilization of hafnium oxide according to an idea of the invention results in a metasurface device with optical transmittance of at least 70%.

Supplemental Information

Section I

Additional Details of Specific Implementations of a Metasurface Fabrication Process. As the first step in the metasurface fabrication process, 500-µm-thick, double-side-polished UV-grade fused silica substrate was vapor-coated (at 150° C.) with an adhesion-enhancing monolayer of hexamethyldisilizane (HMDS). A layer of ZEP 520 A resist was spin-coated onto the substrate, followed by baking on a hot plate at 180° C. for 10 minutes. The spin speed was adjusted to yield a resist thickness varying between 400 mm and 550 mm (as characterized by spectroscopic ellipsometry), depending on the specific metasurface design. To suppress charging during the electron beam (e-beam) lithography, a 20-nm-thick Al layer was thermally evaporated onto the ZEP layer (deposition rate: 0.1 nm/s). The ZEP-resist template was then defined using e-beam lithography (accelerating voltage: 1.00 kV; beam current: 0.2 nA), followed by Al layer removal (AZ 400K 1:3 developer: 2 minutes; DI water: 1 minute) and resist development (hexyl acetate: 2 minutes; isopropyl alcohol: 30 seconds). Deposition of $HfO_2$ to a thickness of 200 nm (deposition rate: 0.11 nm/cycle) was then performed using the low-temperature ALD process detailed immediately below. The deposition thickness was chosen to provide a substantial over-coating of all e-beam patterned resist features and yield a quasi-planar top surface. Following the ALD, the newly-formed $HfO_2$ layer was back-etched to the resist top surface using argon (Ar) ion milling ($HfO_2$ mill rate: ≈0.4 nm/s). Finally, the remaining resist was removed by soaking in a solvent, yielding circular or elliptical HfO$_2$ posts with smooth and straight side-wall profiles (thanks to the resist templating process), of height varying from 400 nm to 550 nm (depending on the specific metasurface), and aspect ratios varying, from about 3 to about 11.

Additional Details of Specific Implementation of a Low-Temperature TDMAH-based HfO$_2$ ALD Process. In step 1 of the ALD cycle, TDMAH vapor (Hf[(CH$_3$)$_2$N]$_4$) was pulsed into the ALD chamber for a duration t$_1$=1 s, reacting with the dangling O—H bonds on the hafnium-coated surface to create a new solid monolayer of Hf[(CH$_3$)$_2$N]$_2$O, and generate the gas by-product (CH$_3$)$_2$NH (dimethylamine). In step 2, high-purity nitrogen (N$_2$) gas was flowed for a duration t$_2$=75 s to fully remove any un-reacted TDMAH vapor and dimethylamine byproduct from the chamber. In step 3, water vapor was pulsed into the chamber for a duration t$_3$=60 ms, reacting with the Hf[(CH$_3$)$_2$N]$_2$O to create a monolayer of HfO$_2$ on the surface. Finally, in step 4, the excessive water vapor as well as the Dimethylamine reaction byproduct were completely (that is, to a level below the level of sensitivity of the appropriate composition-detecting electronic circuitry) removed from the chamber by N$_2$ purging for a duration t$_4$=75 s.

Section II

Figure 8B:
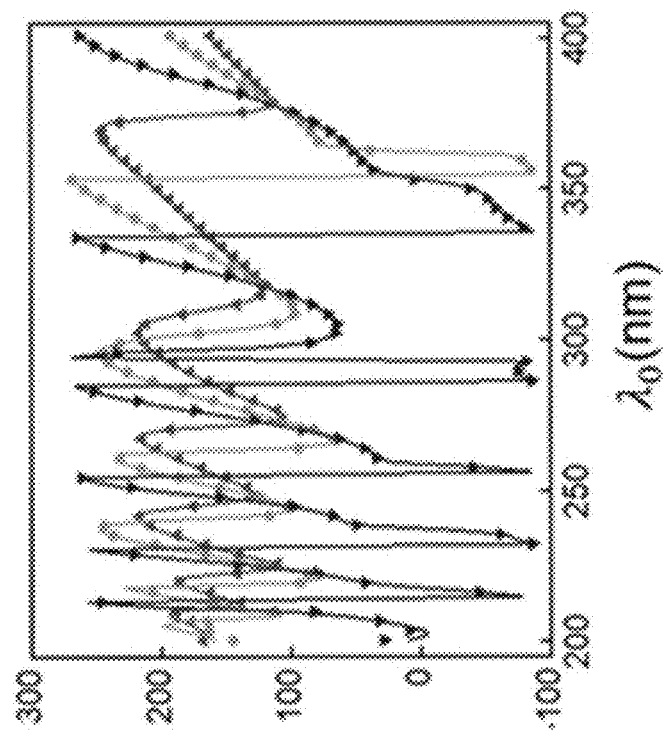
FIGS. 8A, 8B illustrates measured and best-match-modeled Psi and Delta curves for ellipsometric characterization of a low-temperature ALD-deposited $HfO_2$. The legend is common to FIGS. 8A and 8B.
Figure 8A:
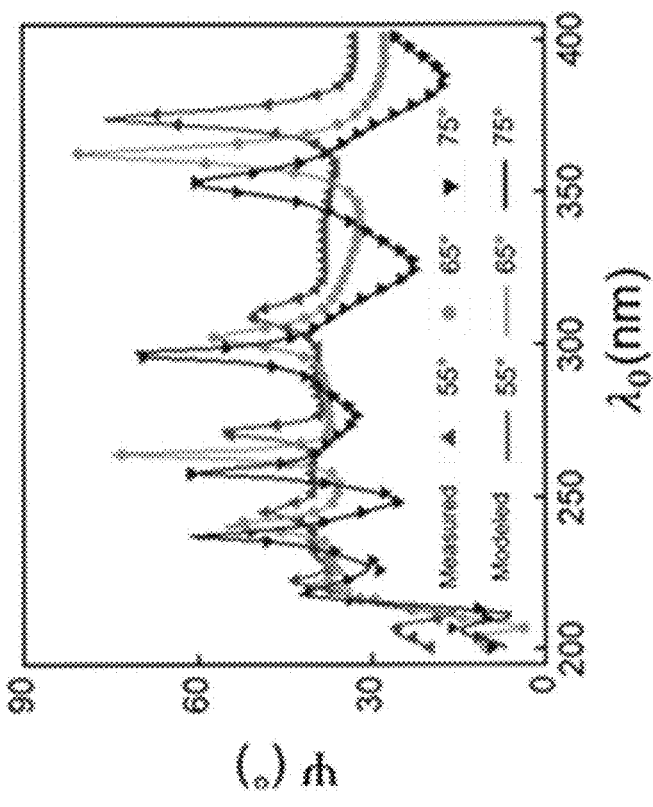
Figure 10A:
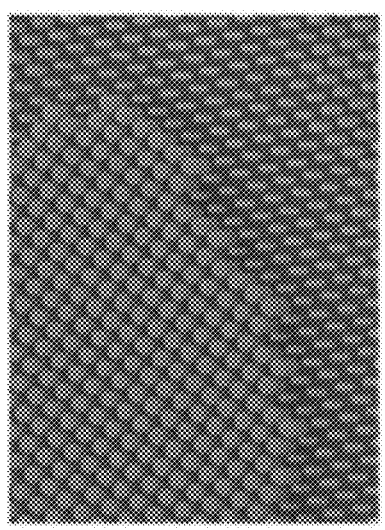
FIGS. 10A, 10B, 10C are scanning electron micrographs (viewing angle: 20°) of selected areas of polarization-independent metasurfaces designed for operation at $\lambda_0=364$ nm.
Figure 11A:
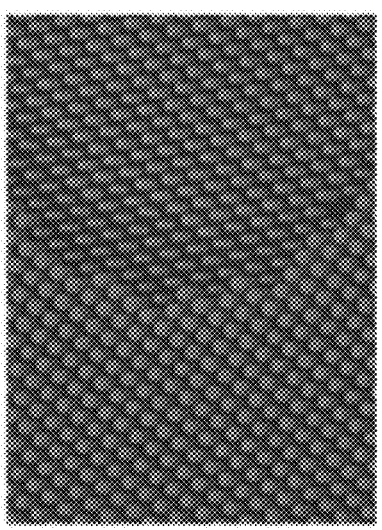
FIG. 11A, 11B, 11C present scanning electron micrographs (viewing angle: 20°) of selected areas of polarization-independent metasurfaces designed for operation at $\lambda_0=325$ nm.
Figure 10B:
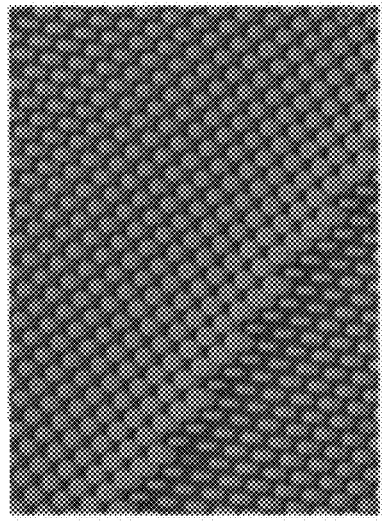
Figure 11B:
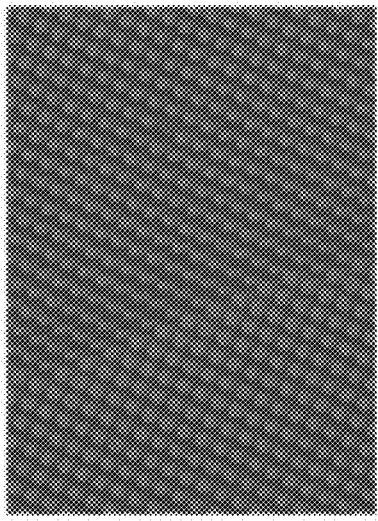
Figure 10C:
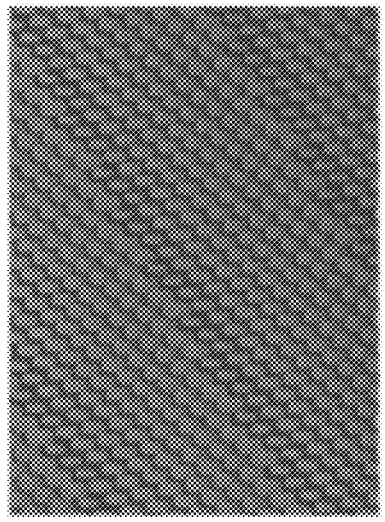
Figure 11C:
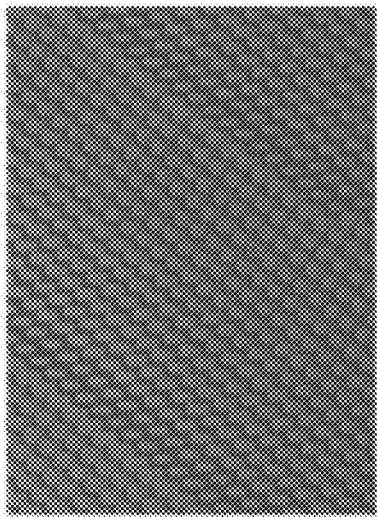

Spectroscopic ellipsometry characterization of low-temperature ALD-deposited HfO$_2$. A 200-nm-thick HfO$_2$ film was grown by low-temperature ALD on a silicon wafer coated with a 300-nm-thick thermal oxide layer. The film's optical properties were characterized by reflection-mode spectroscopic ellipsometry using the interference enhancement method, at three different angles of incidence (55°, 65°, and 75°) with respect to the normal to the plane of the HfO$_2$ layer, The dielectric function of the HfO$_2$ was modelled by a Tauc-Lorentz oscillator. The measured and best-match modeled Psi ($\Psi$) and Delta ($\Delta$) curves (FIGS. 8A, 8B) display close correspondence, as evidenced by a low mean-squared-error for the fit (MSE=6.686). The corresponding curves for the extracted values of refractive index n and extinction coefficient k are plotted in FIG. 1C.

Section III

Figure 9:
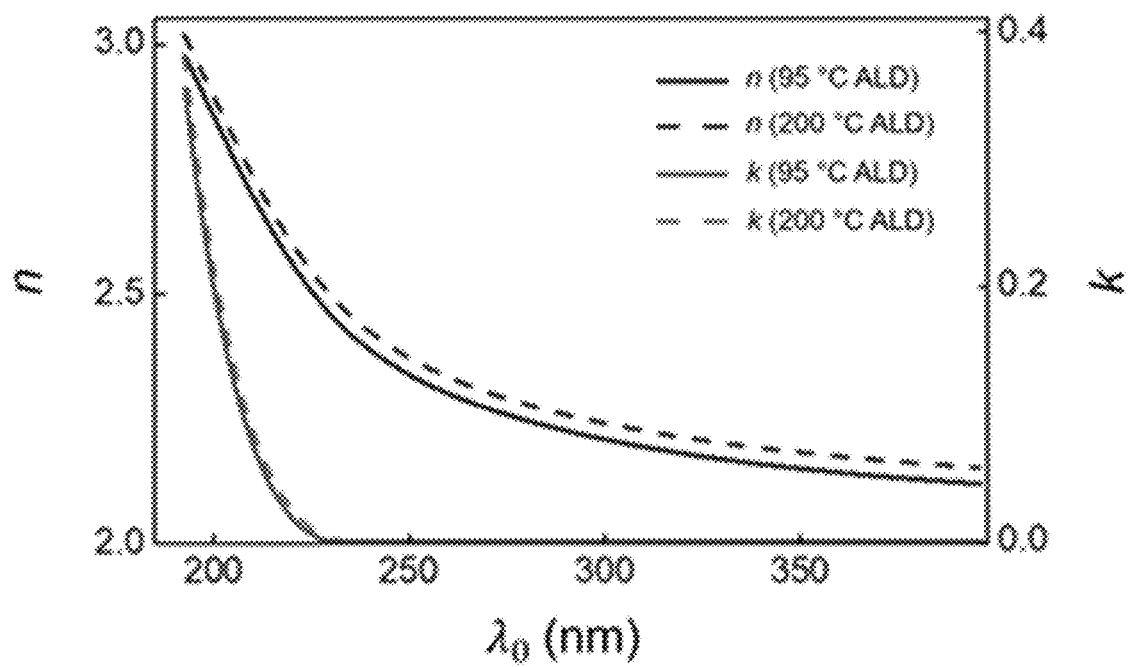
FIG. 9 presents plots of measured refractive index n and extinction coefficient k of $HfO_2$ films deposited by ALD at 95° C. and 200° C., respectively.

Comparison of UV optical properties of ALD-deposited HfO$_2$ at 95° C. and 200° C. The UV optical properties (characterized by spectroscopic ellipsometry) of HfO$_2$ deposited by TDMAH/water-based ALD using the new, low-temperature process (process temperature: T$_p$=95° C., TDMAH pulsing time: t$_1$=1 s, N$_2$ purging time: t$_2$=75 s, H$_2$O pulsing time: t$_3$=60 ms, N$_2$ purging time: t$_4$=75 s, and deposition rate: 0.110 nm/cycle) were compared to those resulting from deposition using a standard process (process temperature: T$_p$=200° C., TDMAH pulsing time: t$_1$=250 ms, N$_2$ purging time: t$_2$=12 s, H$_2$O pulsing time: t$_3$=60 ms, N$_2$ purging time: t$_4$=12 s, and deposition rate: 0.106 nm/cycle), Over the UV range, the two films exhibit (FIG. 9) virtually identical extinction coefficients k (where k≈0 for $\lambda_0$≥220 nm), and refractive indices n that differ only slightly (where values for the film deposited at 95° C. were at most lower by ≈0.03 than those for film deposited at 200° C., at any given wavelength in that range).

Section IV

Design of the polarization-independent metasurfaces. The transmittance, T, and induced phase shift, φ, of an array of cylindrical pillars of diameter D, height H, and lattice spacing P (generally ranging from about 50 nm to about 500 nm, in different examples), under plane-wave normal illumination at wavelengths $\lambda_0$=364 nm, 325 nm, and 266 nm, respectively, were computed using the finite-difference-time-domain (FDTD) simulations with periodic boundary conditions. Given a constant lattice spacing P over the entire metasurface, the function of the cylindrical pillars was to provide a relative propagation phase shift of up to $\varphi_{max} - \varphi_{min}$=2π, between the phase $\varphi_{min}$ induced by the smallest-diameter pillar array (having a small filling factor compared to P, yielding a through-array propagation (refractive) index $n_{min}$≈1, close to the refractive index of air) and the phase $\varphi_{max}$ induced by the largest-diameter pillar array (having a larger filling factor compared to P, yielding a through-array propagation (refractive) index $n_{max}$≈2.1, close to averaged index of refraction n of HfO$_2$ in the UV regime). This requirement sets a lower limit on possible values of H of $H_{min}=\varphi_0/(n_{max}-n_{min})\approx\lambda_0$.

Figure 15A:
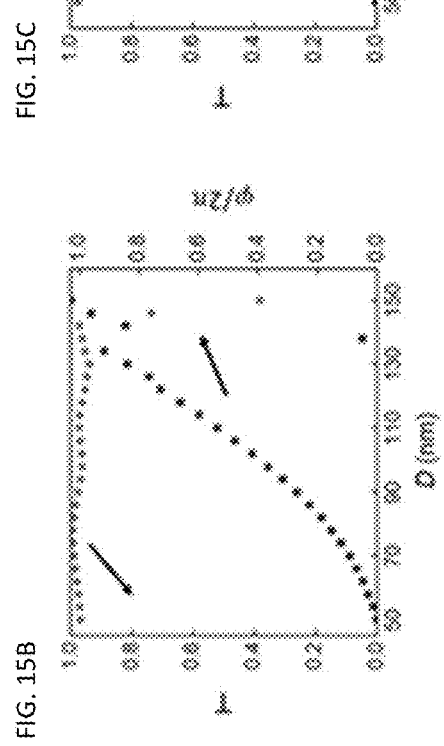
FIGS. 15A, 15B, 15C illustrate transmission intensity T and phase shift φ for an incident light of free-space wavelength $\lambda_0=364$ nm (FIG. 15A), 325 nm (FIG. 15B), and 266 nm (FIG. 15), as a function of cylinder diameter D. For each free-space wavelength design ($\lambda_0=364$ nm, 325 nm, and 266 nm), a corresponding cylinder height (H=550 mm, 500 mm, and 400 nm, respectively), sub-wavelength lattice spacing (P=200 nm, 190 nm, and 150 nm, respectively), and maximum value of pillar diameter ($D_{max}$=160 nm, 150 nm, and 110 nm, respectively) are chosen. For ease of display, the phase shift for pillar arrays with diameter D=50 nm is set to zero for each design.
Figure 15B:
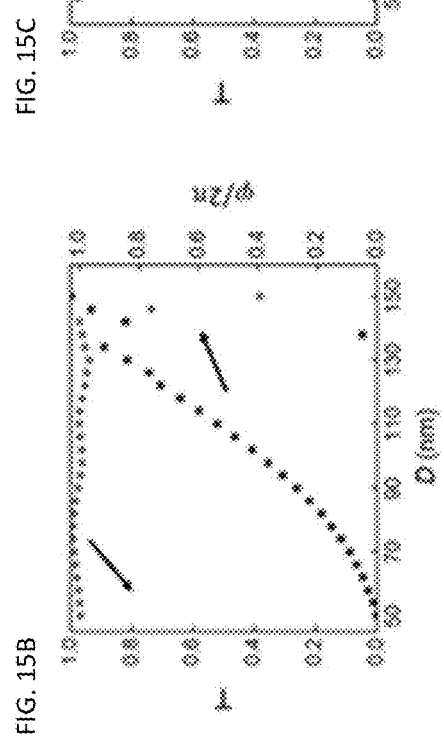
Figure 15C:
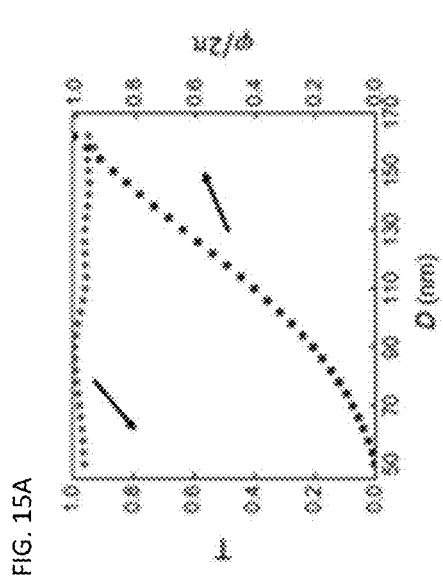

Other constraints help to limit the extent of parameter space necessary to explore during the metasurface design process: (1) to avoid (shin, prevent from happening) diffraction of transmitted light (and, in particular, of a substantially planar optical wavefront incident onto the metasurface) in operation of the metasurface, the upper limit of P, $P_{max}$, is chosen such that $P_{max}\leq\lambda_0$; (2) to stay within the process tolerance of the Damascene-type lithographic process, the minimum value of D, $D_{min}$, is chosen such that $D_{min}$=50 nm; (3) to maintain the mechanical stability of the resist template, the maximum possible value of D is chosen as (P–40 nm). For each targeted free-space operation wavelength $\lambda_0$, different combinations of H, P are surveyed subject to the above requirements, along with the additional constraints that: (1) (D)–φ(D$_{min}$) span at least the full range of [0 2π], as D increases between D$_{min}$ and a value D$_{max}$≥(P–40 nm), where φ(D$_{max}$)=2π, and (2) the transmittance T maintains a high and relatively constant value as D varies over the same range. Sets (H, P, D$_{min}$, and D$_{max}$) satisfying all those conditions are obtained for each of the targeted free-space operation wavelength, $\lambda_0$=364 nm, 325 nm, and 266 nm, of (550, 200, 50, 160), (500, 190, 50, 150), and (400, 150, 50, 110), respectively, where all values are expressed in nanometers (FIGS. 15A, 15B, 15C).

For each implemented polarization-independent metasurface device, the pillar height H and lattice spacing P are chosen based on the metasurface operating wavelength $\lambda_0$. The diameter of each nano-cylinder over the metasurface plane is chosen such that the induced phase-shift φ(D, x$_c$, y$_c$)=mod (φ$^{PI}$(x$_c$, y$_c$), 2π), where φ$^{PI}$ is the required phase-shift profile for each metasurface, D is the diameter of the nanopillar, and (x$_c$, y$_c$) is the center position of each cylinder.

With the knowledge of this technical description, the skilled artisan will readily appreciate that embodiments of the invention provide a metasurface that includes an optical substrate and a spatially-periodic two-dimensional array of cylindrical pillars oriented on the optical substrate substantially normally to the optical substrate, the cylindrical pillars formed from a target material that is devoid of any of silicon, silicon-containing compounds, titania, gallium nitride, and niobium pentoxide. (Here, a spatial period of the array is substantially constant across an area of the optical substrate occupied by the array while a) different cylindrical pillars have different diameters to form areas of the array with different filling factors and b) heights of the cylindrical pillars in the array approximately equal or exceed a free-space operational wavelength chosen within a deep-UV region of the electromagnetic spectrum such that the metasurface is configured to operate, in transmission of light at the operational wavelength, as at least one of a refractive optical element, a diffractive optical element, a birefringent optical element, and a resonant optical element. In at least one of the implementations, a cylindrical pillar in the array may be dimensioned as an elliptic cylinder and the spatial period does not exceed the operational wavelength to not have light at the operational wavelength, incident onto the metasurface, diffract upon transmission through the metasurface. In substantially any embodiment, a minimum diameter of different diameters of the cylindrical pillars has a value of about 50 nm while a maximum diameter of such diameters has a value of about 40 nanometers smaller than the spatial period such that a first area of the array (the one with the smallest filling factor available across the metasurface) has a first effective refractive index for said light transmitted therethrough while a second area of the array (the one with the largest filling factor available across the metasurface) has a second effective refractive index for such light transmitted through the metasurface. (Here, the first effective refractive index has a value of about one and the second effective refractive index has a value of about 2.1.) in practice, any embodiment of such metasurface can be dimensioned to induce a first phase shift for light that propagates through a first auxiliary area of the array characterized by the smallest available filling factor and a second phase shift for said light that propagates through a second auxiliary area of the array characterized by the largest available filling factor (here, the first phase shift is about zero while the second phase shift is about $2\pi$. In at least one case, the first area of the array and the first auxiliary area of the array substantially coincide with one another and/or the second area of the array and the second auxiliary area of the array substantially coincide with one another.

Section V

Characterization procedure for metalenses $L_{364}$ and $L_{325}$. A continuous wave (CW) laser beam (diameter: ≈5 mm) was used to illuminate either metalens $L_{364}$ (using wavelength $\lambda_0$=364 nm) or metalens $L_{325}$ (using wavelength $\lambda_0$=325 nm) at normal incidence, yielding a focused spot in the focal plane of the metalens. The intensity distribution of the image in this plane was captured using a custom-built imaging system including an NA=0.75 objective and an EMCCD camera. The magnification of the system, characterized at each wavelength by translating the focal spot within the field of view of the objective using a calibrated stage, was measured to be 420 and 617 for $\lambda_0$=364 and 325 nm, respectively. The physical size of the focal spot projected by metalenses $L_{364}$ and $L_{325}$ was then derived based on the CCD pixel size and magnification calibrated for respective operating wavelengths.

Section VI

Characterization procedure for self-accelerating beam generators $B_{364}$ and $B_{325}$. A continuous wave (CW) laser beam (diameter: ≈5 mm) was employed to illuminate either self-accelerating beam generator $B_{364}$ (using wavelength $\lambda_0$=364 nm) or generator $B_{325}$ (using wavelength $\lambda_0$=32.5 nm) at the normal incidence. The intensity distributions of the generated self-accelerating beams in selected z-planes beyond the metasurface were recorded using custom-built imaging system including an NA=0.75 objective and an EMCCD camera. Specific z-planes were addressed using a stage which translated the metasurface relative to the camera, along the direction of the laser beam. A 500-µm-diameter aperture was placed behind each metasurface substrate to completely separate the generated self-accelerating beam from directly transmitted light leaking around the edges of the metasurface (which occupied a square area of side length 270 µm). The physical size of the captured intensity profile was determined by comparison to the image of the area occupied by the metasurface.

Section VII

Figure 16A:
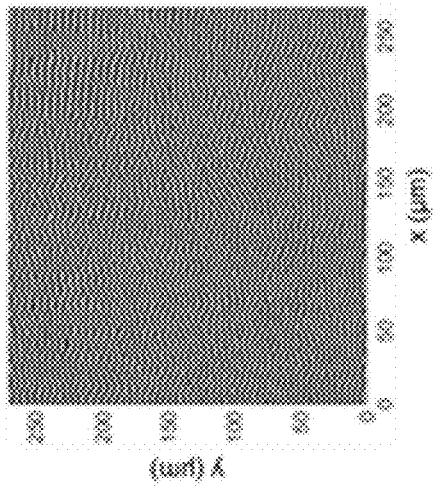
FIGS. 16A, 16B, 16C illustrate metasurface phase shift profiles, $\varphi_{364}^H(x, y, \lambda_0)$, $\varphi_{325}^H(x, y, \lambda_0)$, and $\varphi_{266}^H(x, y, \lambda_0)$, designed to produce a "NIST" holographic image for normal-incidence, plane-wave illumination at $\lambda_0=364$ nm (FIG. 16A), 325 nm (FIG. 16B), and 266 nm (FIG. 16C). Implemented with the use of polarization independent metaholograms, $H_{364}$, $H_{325}$, and $H_{266}$, respectively).
Figure 16B:
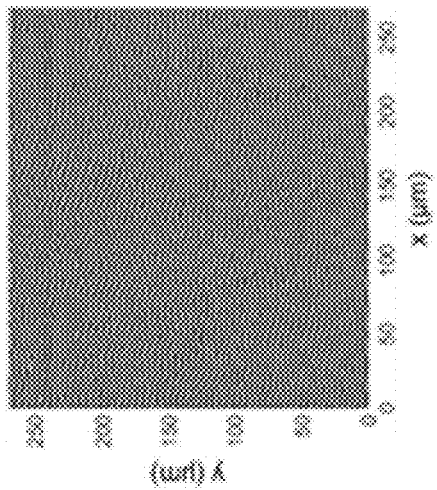
Figure 16C:
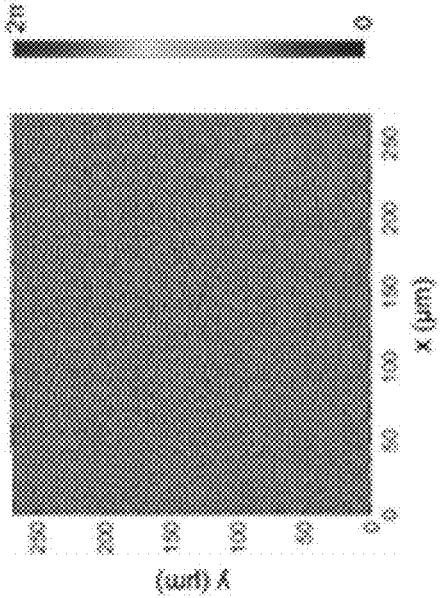

Devising phase shift profiles for metaholograms and $H_{364}$, $H_{325}$, $H_{266}$. The Gerchberg-Saxton algorithm was employed to calculate the respective metasurface phase shift profiles, $\varphi_{364}^H(x, y, \lambda_0)$, $\varphi_{325}^H(x, y, \lambda_0)$, and $\varphi_{266}^H(x, y, \lambda_0)$, required to produce a holographic "NIST" image at three different operation wavelengths $\lambda_0$=364 nm, 325 nm, and 266 nm (shown in FIGS. 16A, 16B, and 16C and implemented, respectively, by metaholograms $H_{364}$, $H_{325}$, and $H_{266}$).

Section VIII

Characterization procedure for metaholograms $H_{364}$ and $H_{325}$. A continuous wave (CW) laser beam (diameter: ≈5 mm) was used to illuminate either metahologram $H_{364}$ (using wavelength $\lambda_0$=364 nm) or metahologram $H_{364}$ (using wavelength $\lambda_0$=325 nm) at normal incidence. An EMCCD camera was placed in the hologram formation plane located 40 mm beyond the metahologram, to directly record the projected holographic image. A 500-µm-diameter aperture was placed behind the metasurface substrate to completely separate the generated holographic image (projected with a 3-mm lateral offset) from directly transmitted light leaking around the edges of the metasurface (which occupied a square area of side length 270 µm).

Section IX

Characterization procedure for metahologram $H_{266}$. A normally incident, 266-nm pulsed laser light (pulse duration: ≈5 ns, repetition rate: 10 Hz, beam diameter: ≈6 mm) was used to directly illuminate the polarization-independent metahologram $H_{266}$. A piece of fluorescent white paper was placed in the hologram formation plane located 40 mm beyond each metahologram and imaged with a custom-built imaging system including a lens and a CCD camera. Holographic images were recorded for device $H_{266}$ under linearly-polarized illumination. 500 images each were recorded and averaged, in each case, with and without laser illumination to subtract background and dark counts from the recorded image as well as to reduce random image noise. A 500-µm-diameter aperture was placed behind each metasurface substrate to completely separate the generated holographic image (projected with a 3-mm lateral offset) from directly transmitted light leaking around the edges of the metasurface (which occupies a square area of side length 270 um). The physical size of the captured holographic image was determined by comparison to the image of an object of known size placed in the plane of the fluorescent white paper.

To verify that the utilized fluorescent transduction scheme is linear, images were recorded under illumination with different laser powers. The ratio of the fluorescence power integrated over the holographic image to that integrated over the image of the directly transmitted beam was found to be invariant as a function of incident laser power, over the full range of power levels used for the experiment.

Section X

Design of spin-multiplexed metasurfaces. The spin-multiplexed metasurfaces implemented in this work imparted independent phase shift profiles on an incident beam depending on its handedness, namely left-handed circularly polarized (LCP) beam of light and right-handed circularly polarized (RCP) beam of light. Let the LCP and RCP states of polarization of incident light be represented by Jones Vectors $|L\rangle = [_{-i}^{1}]$ and $|R\rangle = [_{i}^{1}]$, respectively, and the wave transformation characteristics of the spin-multiplexed metasurface be described by a Jones Matrix $J(x, y)$.

$J(x, y)$ then satisfies the pair of equations $$\begin{cases} e^{i\varphi_1(x,y)}|R\rangle = J(x, y)|L\rangle & (1) \\ e^{i\varphi_2(x,y)}|L\rangle = J(x, y)|R\rangle & (2) \end{cases}$$

It where $\varphi_1(x, y)$ and $\varphi_2(x, y)$ denote the phase shift profiles of the emerging right-handed and left-handed light, for left-handed and right-handed illumination light wavefronts, respectively.

The Jones Matrix $J(x, y)$ can then be written as:

$$J(x, y) = \begin{bmatrix} e^{i\varphi_1(x,y)} & e^{i\varphi_2(x,y)} \\ -ie^{i\varphi_1(x,y)} & ie^{i\varphi_2(x,y)} \end{bmatrix} \begin{bmatrix} 1 & 1 \\ -i & i \end{bmatrix}^{-1} \quad (3)$$

Such a Jones Matrix can be realized using uniaxial (geometrically birefringent) nanostructures providing different phase shifts along their two orthogonal principle axes (here denoted as I and II)[5]. In this study, we use $HfO_2$ nanopillars of in-plane elliptical cross-sections to provide such birefringent functionality. To implement the Jones Matrix of Equation (3), the phase shifts experienced by the constituent linear polarization components of the circularly-polarized incident light decomposed along principal axes I and II must satisfy $\delta_I(x, y)=[\varphi_1(x, y)+\varphi_2(x, y)]/2$, and $\delta_{II}(x, y)=-\pi+[\varphi_1(x, y)+\varphi_2(x, y)]/2$, respectively. In addition, the orientation angle $\theta(x, y)$ of the cylinder's principal axis II must satisfy:

$$\theta(x, y)=[\varphi_1(x, y)-\varphi_2(x, y)]/4 \quad (4)$$

To design spin-multiplexed metasurfaces operating at $\varphi_0=364$ nm, the transmittance and phase shift for propagation of 364-nm-wavelength light, linearly-polarized either (1) parallel to one principle axis I ($T_1$ and $\Delta_1$), or (2) parallel to the other principle axis II ($T_2$ and $\Delta_2$) of an array of elliptical $HfO_2$ pillars (of orthogonal principle axis lengths $D_1$ and $D_2$, height H, and lattice spacing P) were computed using the finite-difference-time-domain (FDTD) simulations with periodic boundary conditions. For a given pillar height H and lattice spacing P, $D_1$ and $D_2$ are iteratively varied to identify orthogonal principle axis combinations simultaneously leading to $|\Delta_1-\Delta_2|\approx\pi$ and $T_1\approx T_2$, in other words, half-wave-plate-like operation. To confine the search to a computationally reasonable parameter space, the targeted values of $\Delta_1$ were restricted to eight discrete, equally spaced values spanning the full 0 to $2\pi$ range (modulo $2\pi$), required for arbitrary hologram implementation. The above constraints were found to be achievable with eight different nanopiliar arrays, each of which were composed of elliptical nanopillars (denoted as $C_1^{364}$ to $C_8^{364}$) having uniform height H=500 nm, uniform spacing P=330 nm, and discrete principle axis combinations, $(D_1, D_2)$, expressed in nanometers, of (70, 190), (80, 240), (90, 260), (100, 270), (190, 70), (240, 80), (260, 90), and (270, 100), respectively (where half of the set is mathematically degenerate under an in-plane coordinate system rotation by 90°). The simulated orthogonal principal axis transmittance combinations, $(T_1, T_2)$, were (93.4%, 62.5%), (93.1%, 68.1%), (95.6%, 61.4%), (89.1%, 51.5%), (62.5%, 93.4%), (68.1%, 93.1%), (61.4%, 95.6%), and (51.5 %, 89.1%) for arrays composed exclusively of pillars $C_1^{364}$ to $C_8^{364}$, respectively. The simulated orthogonal principal axes phase shift combinations, $(\Delta_1, \Delta_2)$, were (0.82π, 2π), (1.35π, 0.41π), (1.58π, 0.67π), (1.87π, 0.87π), (2π, 0.82π), (0.41π, 1.35π), (0.67π, 1.58π), and (0.87π, 1.87π) for the corresponding arrays.

To implement each spin-multiplexed metasurface operating at 364 nm (metahologram $H_{364}^{spin}$ and self-accelerating beam generator $B_{364}^{spin}$), the required phase shifts induced along the two orthogonal principle axes of an elliptical pillar of center position $(x_c, y_c)$, $\phi_I[x_c, y_c]$ and $\phi_{II}[x_c, y_c]$, were calculated as $\phi_I[x_c, y_c]=\mathrm{mod}((\varphi_1(x_c, y_c)+\varphi_2(x_c, y_c))/2, 2\pi)$ and $\phi_{II}[x_c, y_c]=\mathrm{mod}(-\pi+(\varphi_1(x_c, y_c)+\varphi_2(x_c, y_c))/2, 2\pi)$, respectively. $\phi_I$ was then compared to each element $\theta_{ref,i}$ of a discretized reference phase set $\theta_{ref}=\{\pi, 1.25\pi, 1.5\pi, 1.75\pi r, 2\pi, 0.25\pi, 0.25\pi, 0.5\pi, 0.75\pi\}$, in order to identify the closest element to $C_i^{364}$ (in other words, the index i such that $|\theta_{ref,i}-\phi_I|\leq 0.125\pi$ is satisfied). The resulting index i then identifies the specific nanopillar $C_i^{364} \in \{C_1^{364}, \ldots, C_8^{364}\}$ providing the optimal choice for metahologram constituent nanopillar at position $(x_c, y_c)$. For each of such choice, the orientation angle $\theta[x_c, y_c]$ of the cylinder's principal axis II is set to $\theta[x_c, y_c]=\mathrm{mod}((\varphi_1(x_c, y_c)-\varphi_2(x_c, y_c))/4, 2\pi)$.

Following the same design procedure, the spin-multiplexed metasurfaces operating at $\lambda_0=266$ nm can be implemented using a pillar library which consists of eight distinct elliptical nanopillars (denoted as $C_1^{266}$ to $C_8^{266}$) having uniform height H=480 nm, uniform spacing p=160 nm, and eight discrete principle axis combinations, $(D_1, D_2)$, expressed in nanometers, of (118, 58), (126, 62), (126, 70), (118, 50), (58, 118), (62, 126), (70, 126), and (118, 50) respectively (where half of the set is mathematically degenerate under an in-plane coordinate system rotation by 90°). The simulated orthogonal principal axis transmittance combinations, $(T_1, T_2)$, were (93.4%, 99.5%), (94.4%, 98.5%), (94.8%, 94.9%), (97.8%, 96.6%), (99.5%, 93.4%), (98.5%, 94.4%), (94.9%, 94.8%), and (96.6%, 97.8%) for arrays composed exclusively of pillars $C_1^{266}$ to $C_8^{266}$, respectively. The simulated orthogonal principal axis phase shift combinations, $(\Delta_1, \Delta_2)$, were (1.02π, 2π), (1.21π, 0.26π), (1.54π, 0.48π), (1.74π, 0.8π), (2π, 1.02π) (0.26π, 1.21π) (0.48π, 1.54π), and (0.8π, 1.74π) for the corresponding arrays. The two independent phase shift profiles associated with the spin-multiplexed metahologram, $H_{266}^{spin}$, were implemented by choosing, at each position of the metasurface, the optimal nanopillar $C_i^{266} \in \{C_1^{266}, \ldots C_8^{266}\}$, according to the algorithm outlined in earlier part of this section.

Section XI

Characterization procedure for spin-multiplexed self-accelerating beam generator $B_{spin}$. To characterize the spin-multiplexed self-accelerating beam generator $B_{364}^{spin}$, a normally incident, 364-nm continuous wave (CW) laser beam (beam diameter: ≈5 mm) was used to illuminate the device, and a linear polarizer and a quarter-wave plate (of center wavelength 355 nm) were used in addition to control the handedness of the illuminating light. The intensity distributions of the generated self-accelerating beams in selected z-planes beyond the metasurface were recorded using custom-built imaging system including an NA=0.75 objective and an EMCCD camera, under LCP and RCP illumination, respectively. Specific z-planes (ranging from 2.5 mm to 4.5 mm, with an increment of 0.5 mm, for LCP illumination, and ranging from 4.5 mm to 10.5 mm, with an increment of 1.5 mm, for RCP illumination) were addressed using a stage which translates the metasurface relative to the camera, along the direction of the laser beam. A 500-μm-diameter aperture was placed behind the metasurface substrate to completely separate the generated self-accelerating beam from directly transmitted light leaking around the edges of the metasurface (which occupied a square area of side length 330 μm). The physical size of the captured intensity profile was determined by comparison to the image of the area occupied by the metasurface.

Figure 17:
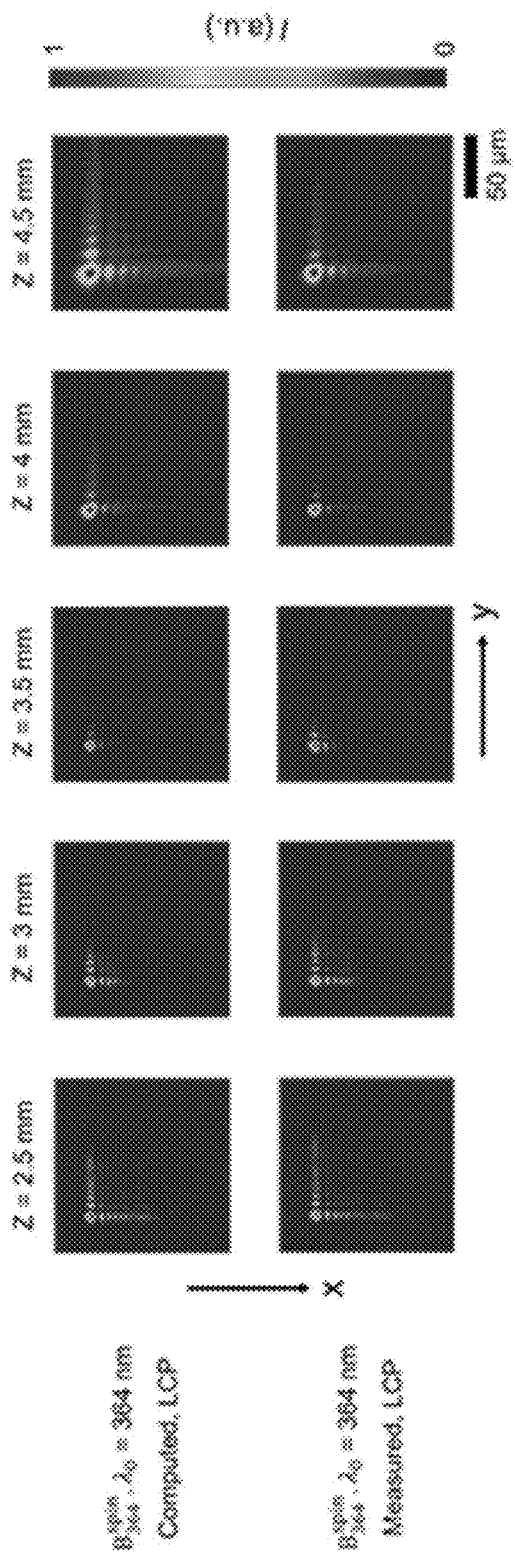
FIG. 17 provides a panel of plots representing computed and measured xy-plane intensity distributions (normalized) at different z planes for device $B_{364}^{spin}$ at its designated wavelength of operation under LCP illumination. Each distribution is displayed over an equal square area of side length 140 µm, but shifted along the —xy direction as a function of increasing z, such that the center of the main lobe maintains an invariant position within each image.
Figure 18:
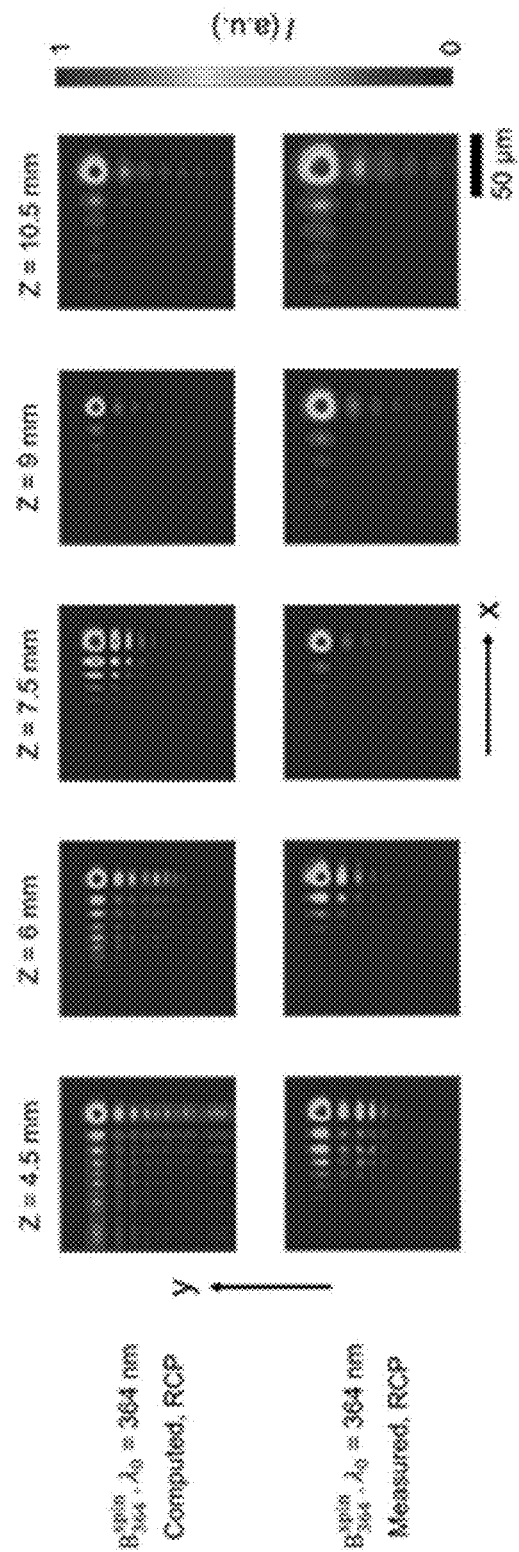
FIG. 18 is a panel of plots illustrating computed and measured xy-plane intensity distributions (normalized) at different z planes for device $B_{364}^{spin}$ at its designated wavelength of operation under RCP illumination. Each distribution is displayed over an equal square area of side length 140 µm, but shifted along the xy direction as a function of increasing z, such that the center of the main lobe maintains an invariant position within each image.

The experimental SAB generated by the device, under LCP and RCP illumination, respectively, exhibited a diffraction-free character with xy-plane intensity distributions similar to the targeted intensity distributions (FIGS. 17 and 18), numerically computed using the angular spectrum representation method that is known in related art, assuming an ideal metasurface realization having both the designed phase shift profile $\varphi^B$ and an unity transmittance T.

Section XII

Implementation of spin-multiplexed metahologram $H_{364}^{spin}$. A spin-multiplexed metahologram, $H_{364}^{spin}$, occupying a square area of side length 330 μm, was implemented for operation at $\lambda_0$=364 nm. Different phase profiles (FIGS. 19A, 19B), $\varphi_{364,LCP}^{H,spin}(x, y, \lambda_0)$ and $\varphi_{364,RCP}^{H,spin}(x, y, \lambda_0)$, all based on the Gerchberg-Saxton algorithm, were calculated for projecting a holographic "NIST" image (for LCP illuminating light) and "NJU" image (for RCP illuminating light), all located in the z=40 mm plane, with an offset of y=−3 mm (FIGS. 20A, 20B), A normally incident, 364-nm continuous wave (CW) laser beam (beam diameter: ≈5 mm) was used to illuminate the metahologram, and a linear polarizer and a quarter-wave plate (with a center wavelength of 355 nm) were used in addition to control the handedness of the illuminating light. An EMCCD camera was placed in the hologram formation plane located 40 mm beyond the metahologram to directly record the projected holographic images under LCP and RCP illumination, respectively. A 500-μm-diameter aperture was placed behind the metahologram substrate to completely separate the generated holographic image (projected with a 3-mm lateral offset) from directly transmitted light leaking around the edges of the metasurface (which occupied a square area of side length 330 μm).

Section MIL

Implementation of spin-multiplexed metahologram $H_{266}^{spin}$. Two different phase shift profiles over 320-μm-square areas (FIGS. 21A, 21B), $\varphi_{266,LCP}^{H,spin}(x, y, \lambda_0)$ and $\lambda_{266,RCP}^{H,spin}(x, y, \lambda_0)$, were calculated using the Gerchberg-Saxton algorithm to achieve projection of distinct holographic images under normal-incidence, plane-wave illumination at $\lambda_0$=266 nm, namely, images forming indicia "deep" and "UV", respectively, in the z=40 mm plane, with an offset y=−3 mm (FIGS. 22A, 22B), A normally incident, 266-nm pulsed laser (pulse duration: ≈5 ns, repetition rate: 10 Hz, beam diameter: ≈6 mm) was used to illuminate the spin-multiplexed metahologram $H_{266}^{spin}$. In addition, a linear polarizer and a quarter-wave plate (with a center wavelength of 266 nm) were employed to control the handedness of the illuminating light. A piece of fluorescent white paper was placed in the hologram formation plane located 40 mm beyond the metahologram and imaged with a custom-built imaging system including a lens and a CCD camera. Holographic images were recorded for device $H_{266}^{spin}$ under LCP and RCP illumination, respectively. Five hundred images were recorded and averaged, in each case, with and without laser illumination to subtract background and dark counts from the recorded image as well as to reduce random image noise. A 500-μm-diameter aperture was placed behind each metasurface substrate to completely separate the generated holographic image (projected with a 3-mm lateral offset) from directly transmitted light leaking around the edges of the metasurface (which occupied a square area of side length 320 μm). The physical size of the captured holographic image was determined by comparison to the image of an object of known size placed in the plane of the fluorescent white paper screen.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the 10% range of the value itself, more preferably within the range of +/−5% of the value itself, and even more preferably within the range of +/−2% or less of the value itself The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

For example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular or normal to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). As an example, the use of the terms "substantially flat" or "substantially planar" in reference to the specified surface implies that such surface may possess a degree of non-flatness and/or roughness that is sized and expressed as commonly understood by a skilled artisan in the specific situation at hand. Other specific examples of the meaning of the terms "substantially", "about", and/or "approximately" as applied to different practical situations may have been provided elsewhere in this disclosure.

With the benefit of this disclosure, a skilled artisan readily appreciates that—given the negligible extinction coefficient of the target material (in discussed non-limiting examples—$HfO_2$ deposited with the use a low-temperature-ALD process according to the idea of the invention deposited $HfO_2$ down at wavelengths as low as that corresponding to the bandgap of the target material ($\lambda_0 \approx 217$ nm), and due to the inherent high patterning fidelity of the Damascene-type process—metasurfaces formed according to the idea of the invention can be structured to operate at substantially shorter wavelengths than those discussed above. Moreover, experimental demonstration of broader range of device functionalities in the deep-UV regime other than hologram projection should be possible by using a continuous-wave light source and an appropriate direct imaging system.

The constituent nanostructured elements of the metasurfaces were formed of hafnium oxide—a CMOS-compatible, wide-bandgap, low-loss UV-transparent, high-refractive-index dielectric material deposited using a judiciously-defined low-temperature atomic layer deposition (ALD) and patterned using high-aspect-ratio, resist-based lithography technique. With the above identified new material and developed fabrication technique, the metasurfaces designed for operation at the three representative UV wavelengths of 364 nm, 325 nm, and 266 nm were practically implemented. The metasurfaces were configured to perform a variety of optical functions (and, specifically, high-numerical-aperture lensing, accelerating beam generation, and hologram projection, including under spin control for the last two applications). This achievement opens the way for low-form-factor and multifunctional photonic systems based on UV flat optics, and suggests promising applications in photolithography, high-resolution imaging, UV spectroscopy and quantum information processing and enabling applications such as atom trapping, fluorescence imaging, and circular dichroism spectroscopy in a compact form factor.

Features of the specific implementation(s) of the idea of the invention is described with reference to corresponding drawings, in which like numbers represent the same or similar elements wherever possible. In the drawings, the depicted structural elements are generally not to scale, and certain components are enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated, portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed.

The invention as recited in claims appended to this disclosure is intended to be assessed in light of the disclosure as a whole.

What is claimed is:

1. A method for fabricating a structured electromagnetic metasurface containing a sub-wavelength-scaled surface pattern, the method comprising:
    in an atomic layer deposition (ALD) chamber, conformally filling an open volume formed in a patterned layer of a resist material with a target material with the use of an ALD process conducted at a temperature not exceeding 105° C. to define a material preform, the target material being devoid of any of silicon, titania, gallium nitride, and niobium pentoxide; and
    removing the resist material with a solvent to expose the sub-wavelength-scaled pattern structure of the target material, wherein the pattern structure is dimensioned to operate as at least one of refractive, diffractive, birefringent, and resonant optical elements at a wavelength defined in a deep-UV range of an electromagnetic spectrum.

2. The method according to claim 1, comprising patterning the resist material that is a positive tone electron-beam resist material to form the open volume therein.

3. The method according to claim 1, wherein said conformally filling includes depositing hafnium oxide with a Tetrakis(dimethylamino)Hafnium (TDMAH) precursor.

4. The method according to claim 1,
    wherein said conformally filling includes overcoating boundaries of the open volume at a top surface of the patterned layer of the resist material to form a protrusion of the target material above the top surface of the patterned layer, and further comprising back-etching said protrusion with ion milling to yield a substantially planar top surface of the material preform.

5. The method according to claim 1, wherein said removing the resist material includes soaking the material preform in a solvent to expose an array of columns of target material of a sub-micron height and different aspect ratios, each aspect ratio smaller than 11, an aspect ratio of a respective column defined as a ratio of a height to a transverse dimension thereof.

6. The method according to claim 1, wherein said removing the resist material includes soaking the material preform in a solvent to expose an array of columns of target material of sub-micron height and aspect ratios of less than 9.

7. The method according to claim 1, wherein said removing the resist material includes soaking the material preform in a solvent to expose an array of columns of the target material of sub-micron height and aspect ratios of less than 7.

8. The method according to claim 1, wherein said removing the resist material includes soaking the material preform in a solvent to expose and array of columns of the target material of sub-micron height, the array including different columns having corresponding different aspect ratios within a range from about 3 to about 11.

9. The method according to claim 1, wherein said removing the resist material includes soaking the material preform in a solvent to expose an array of columns of target material of a sub-micron height and different aspect ratios wherein the array of columns is a spatially-periodic array with a spatial period having a value within a range from about 50 nm to about 500 nm.

10. The method according to claim 1, comprising at least one of the following steps:
   a) delivering a first vapor of a first precursor material into the ALD chamber in a during a time-window of a first duration to form a solid monolayer of $Hf[(CH_3)_2N]_2O$ on a surface of a chosen substrate while generating a fluid by-product $(CH_3)_2NH$(dimethylamine) simultaneously with formation of said solid monolayer;
   b) removing a portion of the vapor of the first precursor material that has not reacted with the surface of the target material and the fluid by-product from the ALD chamber as a result of purging the ALD chamber with nitrogen gas;
   c) delivering a second vapor of liquid into the ALD chamber during a time window of a second duration for create a monolayer of the target material on the surface;
   d) removing excess of the second vapor by purging the ALD chamber with nitrogen; and
   e) repeating steps a) through d) multiple times to accumulate a layer of the target material having a predetermined thickness on the surface.

11. The method according to claim 10, wherein at least one of the following conditions is satisfied:
   i) said delivering the first vapor of the first precursor material includes delivering the vapor of $Hf[(CH_3)2N]_4$ (TDMAH);
   ii) said target material is $HfO_2$;
   iii) said liquid is water;
   iv) said fluid by-product is gas; and
   v) said removing the portion of the vapor of the first precursor material include removing the first precursor material from the ALD chamber down to below detectable limits achievable with the use of electronic circuitry configured to detect the present of the first precursor material and utilized in operation of the ALD chamber.

12. A method for fabricating an all-dielectric metasurface optical device including at least one of a polarization-independent metalens, a polarization-independent metahologram, a polarization-independent Airy beam generator, said device having optical transmittance of at least 50% at a wavelength of 364 nm or shorter, the method comprising:
   as part of an atomic layer deposition process conducted at a temperature not exceeding 105° C., conformally filling an open volume, formed in a patterned layer of an electron-beam resist material, with hafnium oxide material.

13. The method according to claim 12, wherein the optical transmittance of the device is at least 70%.

* * * * *